(12) United States Patent
Zhang

(10) Patent No.: US 8,410,658 B2
(45) Date of Patent: Apr. 2, 2013

(54) MULTI-LAYER ELECTROSTATIC ENERGY HARVESTER AND METHOD OF MAKING THE SAME

(76) Inventor: Gang Zhang, Monterey Park, CA (US)

( * ) Notice: Subject to any disclaimer, the term of this patent is extended or adjusted under 35 U.S.C. 154(b) by 648 days.

(21) Appl. No.: 12/473,439

(22) Filed: May 28, 2009

(65) Prior Publication Data

US 2010/0301699 A1 Dec. 2, 2010

Related U.S. Application Data

(60) Provisional application No. 61/057,201, filed on May 30, 2008.

(51) Int. Cl.
*H02N 1/00* (2006.01)
(52) U.S. Cl. ........................ 310/309; 322/2 A
(58) Field of Classification Search .................. 310/309; 257/415; 322/2 A; 73/514.32
See application file for complete search history.

(56) References Cited

U.S. PATENT DOCUMENTS

| | | | |
|---|---|---|---|
| 3,210,643 A * | 10/1965 | Else et al. ..................... | 322/2 A |
| 6,654,158 B2 * | 11/2003 | Helsel et al. ................... | 359/292 |
| 6,698,082 B2 * | 3/2004 | Crenshaw et al. .............. | 29/593 |
| 6,858,970 B2 | 2/2005 | Malkin | |
| 6,894,420 B2 * | 5/2005 | Rodgers ........................ | 310/309 |
| 6,997,054 B2 * | 2/2006 | Tsugai ........................ | 73/504.12 |
| 7,211,923 B2 * | 5/2007 | Potter ........................... | 310/309 |
| 7,322,240 B2 * | 1/2008 | Robert ........................ | 73/514.32 |
| 7,471,033 B2 | 12/2008 | Thiesen | |
| 8,018,119 B2 * | 9/2011 | Matsubara et al. ........... | 310/309 |
| 2007/0193355 A1 * | 8/2007 | Axelrod et al. ............. | 73/514.32 |
| 2007/0272015 A1 * | 11/2007 | Kazama et al. ............. | 73/504.08 |
| 2010/0301699 A1 * | 12/2010 | Zhang ........................... | 310/300 |

OTHER PUBLICATIONS

"Feasibility of a Multi-layer Electrostatic Micro Energy Harvester for Higher Power Output", Zhang and Ye, Power MEMS 2009, Washington DC Dec. 1-Apr. 2009.*
"Simulation of an Electrostatic Energy Harvesters at Large Amplitude Narrow and Wide Band Vibrations", Tvedt et al., DTIP of MEMS and MOEMS, Apr. 9-11, 2008.*
Meninger, "Vibration-to-Electric Energy Conversion," IEEE Transactions on Very Large Scale Integration (VLSI) Systems, vol. 9, No. 1, pp. 64-76 (2001).
Roundy, "Micro-Electrostatic Vibration-to-Electricity Converters," Proceedings of IMECE2002 ASME International Mechanical Engineering Congress & Exposition, IMECE2002-39309, New Orleans, Louisiana, Nov. 17-22, 2002.
Lin, "Fabrication and Characterization of a Micro Turbine/Bearing Rig," Proc. 12th IEEE Micro Electro Mechanical Systems Workshop, IEEE, pp. 529-533 (1999).
Fréchette, "High-Speed Microfabricated Silicon Turbomachinery and Fluid Film Bearings," Journal of Microelectromechanical Systems, vol. 14, No. 1, pp. 141-152 (2005).
Miao, "Micro-machined variable capacitors for power generation," Electrostatics 2003, Edinburgh, UK, Mar. 23-27, 2003.
Roundy, "A study of low level vibrations as a power source for wireless sensor nodes," Computer Communications, vol. 26, pp. 1131-1144 (2003).
Roundy, "Energy Scavenging for Wireless Sensor Nodes with a Focus on Vibration to Electricity Conversion," Ph.D. Dissertation, The University of California, Berkeley (2004).

* cited by examiner

*Primary Examiner* — Tran N. Nguyen
*Assistant Examiner* — Thomas Truong

(57) ABSTRACT

An electrostatic energy harvester comprises at least a plurality of variable capacitor layers. In one embodiment, at least two of the variable capacitor layers are directly bonded together. In another embodiment, at least two of the variable capacitor layers are bonded together with at least one moving mass layer. Still in another embodiment, at least two of the variable capacitor layers are located at different heights and are located separately from each other. A method of making such a device is also disclosed.

20 Claims, 16 Drawing Sheets

MULTI-LAYER ELECTROSTATIC ENERGY HARVESTER AND METHOD OF MAKING THE SAME

CROSS-REFERENCE TO RELATED APPLICATIONS

This application claims the benefit of provisional patent application Ser. No. 61/057,201, filed May 30, 2008 by the present inventor.

STATEMENT REGARDING GOVERNMENT SPONSORED RESEARCH

This invention was made with U.S. Government support under grant number NSF/SBIR 0711677 from the National Science Foundation. The Government has certain rights in this invention.

FIELD OF THE INVENTION

This invention generally relates to the field of electrostatic devices. More particularly, it relates to a multi-layer electrostatic energy harvester and to a method of making such a device.

BACKGROUND OF THE INVENTION

With advances in ultra-low power IC (integrated circuits) design and MEMS (Microelectromechanical Systems) technologies, the size of electronic circuits and devices and the energy needed to drive them have been being reduced significantly. Harvesting energy from the environment to power microelectronics devices (e.g., mobile and wireless electronics) and MEMS devices has become a practical and alternative solution for replacing batteries. As energy harvesters produce power in the μW to mW range, outputting electric energy as much as possible is the primary goal of energy harvester development.

Energy harvesting or scavenging refers to the conversion of ambient energy such as thermal, radiant and kinetic energy into electrical energy. Vibration-to-electric energy conversion is one type of energy harvesting where ambient vibration energy is extracted and converted by a vibration energy harvester into electrical energy. There are three mechanisms for converting vibration energy, i.e., electromagnetic (inductive), electrostatic (capacitive), and piezoelectric conversion.

Electrostatic conversion is one of the three conversion mechanisms in which a variable capacitor in an electrostatic energy harvester extracts energy from the work done by vibrations against the electric field formed between the two plates of the charged capacitor. One remarkable benefit of electrostatic harvesters is that they can be microfabricated with MEMS technologies. Therefore, micro- or meso-scale and high precision mechanical structures (variable capacitors) can be manufactured. In addition, micromachined harvesters can be easily integrated with microelectronics, which makes it possible to realize completely autonomous self-powered microsystems.

As the power harvested from vibrations is relatively low, which is typically in the μW to mW range, outputting electric energy as much as possible is the primary goal of energy harvester development. Current device improvements focus on optimizing mechanical structures and power processors (circuits) of vibration energy harvesters for fighting power loss during energy conversion. This invention, however, can realize a high-power output electrostatic energy harvester through a unique multi-layer structure design. This invention presents a new route to increase converted power by increasing the actual achievable power density (AAPD) of an energy harvester.

In vibration energy harvesting, power density is a useful indicator for characterizing and comparing energy harvesters, which is defined in Equation 1. However, it should be used cautiously to avoid being misled. For example, for building a self-powered microsystem containing a certain type of electrostatic micro harvester, a certain space or volume is assigned to be occupied by the harvester. In theory, the maximum converted power would be the product of the assigned volume and the power density of the harvester. This maximum power can be reached only when the microfabricated harvester can fully occupy the assigned volume. However, this is usually not the case because of the limitations of current silicon microfabrication technologies. To more precisely describing this situation, the inventor of this invention has created a term called actual achievable power density (AAPD) defined in Equation 2. Substitution of Equation 1 into Equation 2 yields Equation 3. As $V_h$ is usually less than, in some cases, much less than, $V_a$, $p_a$ is therefore less than p. The ratio of $V_h/V_a$ reflects the usage ratio of a given volume by a harvester.

$$p = \frac{P}{V_h} \quad (1)$$

$$p_a = \frac{P}{V_a} \quad (2)$$

$$p_a = \frac{P}{V_a} = \frac{p \times V_h}{V_a} = p \times \frac{V_h}{V_a} \quad (3)$$

where p is harvester power density; $p_a$ is actual achievable power density; P is converted power; $V_h$ is harvester volume; and $V_a$ is assigned volume.

Equation 3 implies another approach to increase power output in addition to improving harvester mechanical structures and power electronics that are currently being worked on. This additional approach is to increase $p_a$ or AAPD by making use of an assigned volume as much as possible, i.e., increasing $V_h$. Efficiently using an allowed volume is extremely vital to the application of micro energy harvesters in microsystems where space is precious and desired to be made the best use of to its maximum. In some cases, not only is a space for a micro-harvester is restricted, but its footprint area is also restricted as well. A flexible microfabrication technology is therefore strongly required to fabricate complex, arbitrary micro energy harvesters that can occupy a given volume as much as possible.

Currently proposed various dynamic models for vibration energy harvesters show that for a given vibration source the converted power is proportional to the moving mass in a harvester and its travel along with the acceleration. For an electrostatic harvester, vibration energy is converted by a variable capacitor in the harvester when it oscillates between a maximum capacitance $C_{max}$ and a minimum capacitance $C_{min}$. The converted energy per cycle is proportional to the capacitance change ($\Delta C = C_{max} - C_{min}$). The capacitance change is related to the geometry of the variable capacitor. A larger capacitance change is highly desired as it is capable of converting more energy or it can reduce the input voltage and/or the maximum achievable voltage during energy conversion suitable for low voltage circuits.

Reported prototype electrostatic micro energy harvesters fall into three categories: in-plane constant gap comb capacitor type, in-plane gap closing comb capacitor type, and out-of-plane gap closing plate capacitor type.

FIG. 1 schematically illustrates various views of an example of an one-layer in-plane comb capacitor type electrostatic harvester structure. FIG. 1A shows a perspective view of a comb capacitor type electrostatic harvester structure 100 that is anchored to a substrate 102 through four anchors 104, 106, 108, and 110. FIG. 1B shows only the layout of the four anchors on the substrate without the harvester structure. FIGS. 1C and 1D show a perspective view and a top side view of the harvester structure, respectively. The harvester structure comprises two fixed comb finger electrodes 114 and 116, a movable comb finger electrode 112, and two spring structures 118 and 120 that support the movable electrode 112. The two fixed electrodes 114 and 116 are secured to the two anchors 104 and 106, respectively. The two spring structures 118 and 120 are also secured to the two anchors 108 and 110 at two anchor points 122 and 124, respectively so that the movable electrode is suspended above the substrate by the two spring structures. The movable electrode has two sets of comb fingers which form two variable comb capacitors with the two fixed electrodes. The fingers of each comb capacitor are arranged to be interdigitated. The movable electrode also serves as a moving mass. In this harvester structure, the two spring structures are designed so that the movable electrode can only move along the Y-axis (see FIG. 1D) with vibration. Therefore, this harvester structure is an in-plane constant gap comb capacitor type. The gap means a separation between two neighbouring fingers. Those skilled in the art will understand that the spring structures can also be designed so that the movable electrode can only move along the X-axis. Then the harvester structure becomes an in-plane gap closing comb capacitor type. FIG. 1 only shows the mechanical part of the harvester. A workable energy harvester also comprises at least a proper circuitry (not shown in FIG. 1) that connects to the fixed electrodes and the movable electrode so that ambient vibration energy can be harvested and converted to electric energy. Note that the core of the mechanical part of an electrostatic harvester is its variable capacitor structures. The electrostatic energy harvester example shown in FIG. 1 comprises two fixed electrodes, one movable electrode, and two spring structures that forms two variable capacitors. Those skilled in the art will understand that a minimum requirement for forming a variable capacitor only needs one fixed electrode, one movable electrode, and one spring structure. Therefore, in this invention, the mechanical part of an in-plane electrostatic energy harvester comprising at least one fixed electrode, one movable electrode, and at least one spring structure can be generally called a variable capacitor layer.

For the in-plane comb capacitor type electrostatic energy harvester, increasing converted power requires increasing the thickness and the aspect-ratio of the comb capacitor, meaning increasing mass and capacitance. To fulfil the above requirements, DRIE (deep reactive ion etching) has become the most suitable microfabrication process for making silicon-based single-layer comb capacitor type electrostatic energy harvesters. Even though DRIE can produce high-aspect-ratio silicon structures, its reasonable aspect-ratio is only up to 50. For example, for an in-plane constant gap capacitor having a gap separation of 4 µm, the maximum silicon layer thickness would be less than 200 µm. Note that the capacitance change is inversely proportional to the gap separation. Therefore, we have a thickness constrain. To further increase converted power, we have to increase the footprint area of the harvester. However, in a microsystem, an allowed footprint area provided for a harvester is usually also constrained. In addition, DRIE is not a truly three-dimensional (3-D) fabrication process. Rather, it is a 2.5-D process, meaning that either the cross-section of a silicon structure along z-axis is exactly the same or its geometry has very limited change along z-axis. Lacking of geometry change along z-axis restricts DRIE to form complex silicon structures which are essential for a harvester to fill up a given volume. Summarily, unless an assigned volume in a microsystem is exactly the same as a harvester that can be made with DRIE (a very rare situation), the fabricated harvester cannot usually fully use the given volume. FIG. 2 schematically illustrates such a situation where an one-layer comb capacitor type electrostatic energy harvester structure 126 (its spring structures not shown) only occupies a portion of a given volume 128, meaning a low AAPD and therefore a low converted power in terms of this given volume.

A logical solution for an energy harvester to occupy more volume is to stack more one-layer variable capacitor structures to form a multi-layer variable capacitor structure such as a three-layer example shown in FIG. 3 where three identical one-layer variable capacitor structures 126, 132, and 134 (its spring structures not shown) are bonded together in the same given volume 128.

Bonding of pre-micromachined silicon structures has become a standard practice in MEMS fabrication. One well-known example is the MIT's micro gas turbine engine fabricated by bonding five layers of pre-micromachined silicon wafers. However, the difficulty of forming a multi-layer electrostatic harvester is that its each variable capacitor layer contains discrete silicon features shown in FIG. 4 where two fixed electrodes 138 and 140 do not mechanically connect with a moving electrode 142 on the same layer. Obviously this kind of layer cannot be made separately as discrete features will fall down. This is a fundamental drawback in standard bulk micromachining plus silicon bonding. To overcome this technical barrier, special fabrication approaches have to be developed. In the case of MIT's micro-engine, for making the layers containing discrete features, one solution is to use temporary silicon connections which support discrete silicon features. After all layers are bonded together, the temporary silicon connections are either cut with a laser beam or mechanically fractured to release the discrete features. However, this post separation treatment only works for special designs. In addition, it is not a reliable and desirable approach as the removal of the silicon mechanical connections is the last step of the process. If it fails, all previous work will be wasted. To avoid making the layers containing discrete features, another solution is to do multiple etching on both sides of silicon layers. However, DRIE can be performed only once on each side of a layer, which restricts to form more complex structures. Besides, this solution involves many process steps and may face difficult operations, low throughput and low yield.

As the converted power is proportional to the moving mass of an energy harvester, using silicon as the material of harvesters has an intrinsic drawback due to its low density (2.33 g/cm$^3$). Therefore, attaching a high-density material on the movable electrode of an electrostatic harvester is highly desirable. Miao et al. proposed to electroplate a layer of gold (density: 19.3 g/cm$^3$) on the silicon movable electrode of their out-of-plane gap closing type electrostatic energy harvesters. It is not difficult to electroplate a metal on a silicon plate capacitor. But it would be quite challenging to electroplate a layer of metal just on the silicon movable electrode of a microfabricated comb capacitor type harvester. Roundy proposed to attach a piece of a tungsten alloy (density: ~17 g/cm$^3$) on his comb capacitor type silicon harvester. However, making a precise micro-scale tungsten alloy mass and then precisely attaching it on a micromachined silicon harvester seem not to be a feasible mass production approach.

SUMMARY OF THE INVENTION

A first aspect of the invention provides an electrostatic energy harvester, comprising: a multi-layer structure comprising a plurality of variable capacitor layers, each of which comprises at least one fixed electrode, a movable electrode, and at least one spring structure that supports the movable electrode wherein the at least one fixed electrode forms at least one variable capacitor with the movable electrode, wherein the plurality of variable capacitor layers form at least one multi-layer variable capacitor comprising at least one multi-layer fixed electrode, a multi-layer movable electrode, and at least one multi-layer spring structure, and wherein at least two of the plurality of variable capacitor layers are formed separately from each other and thereafter directly bonded together.

A second aspect of the invention is an extension of the first aspect, further comprising: a substrate; and a plurality of anchor components which are secured to the substrate; wherein the at least one multi-layer variable capacitor is anchored to the substrate by bonding the at least one multi-layer fixed electrode and the at least one multi-layer spring structure to the plurality of anchor components; and wherein the multi-layer movable electrode is suspended above the substrate by the at least one multi-layer spring structure.

A third aspect of the invention provides an electrostatic energy harvester, comprising: at least two variable capacitor layers, each of which comprises at least one fixed electrode, a movable electrode, and at least one spring structure that supports the movable electrode wherein the at least one fixed electrode forms at least one variable capacitor with the movable electrode; and at least one moving mass layer, each of which comprises at least one moving mass component; wherein the at least two variable capacitor layers and the at least one moving mass layer are bonded together to form at least one multi-layer variable capacitor comprising at least one multi-layer fixed electrode, a multi-layer movable electrode, and at least one multi-layer spring structure.

A fourth aspect of the invention is an extension of the third aspect, further comprising: a substrate; and a plurality of anchor components which are secured to the substrate; wherein the at least one multi-layer variable capacitor is anchored to the substrate by bonding the at least one multi-layer fixed electrode and the at least one multi-layer spring structure to the plurality of anchor components; and wherein the multi-layer movable electrode is suspended above the substrate by the at least one multi-layer spring structure.

A fifth aspect of the invention provides an electrostatic energy harvester, comprising: a substrate; and a plurality of variable capacitor layers secured to the substrate, each of which comprises at least one fixed electrode and a movable electrode being movable with respect to the substrate, wherein the at least one fixed electrode forms at least one variable capacitor with the movable electrode, wherein at least two of the variable capacitor layers are located at different heights above a same surface of the substrate and are located separately from each other, wherein the at least two variable capacitor layers are secured at different locations on the substrate, and wherein each of the at least two variable capacitor layers is secured directly to the substrate.

A sixth aspect of the invention provides a method for fabricating a multi-layer silicon-based structure, comprising: forming a plurality of separate layers that compose a multi-layer silicon-based structure, wherein each of the plurality of separate layers comprises at least one material and wherein at least one of the plurality of separate layers comprises a sacrificial material; bonding at least the plurality of separate layers together; and removing at least a portion of the sacrificial material.

A seventh aspect of the invention provides a method for fabricating a separate layer which is a portion of a multi-layer silicon-based structure and which comprises at least two materials, comprising: providing a silicon layer; selectively etching the silicon layer to form a desired silicon mold; filling at least one material into the silicon mold to form a multi-material layer; planarizing the multi-material layer as desired.

A eighth aspect of the invention provides a method for filling a material into a silicon mold, comprising: filling particles of a material into a silicon mold; and firing the particles.

Other aspects of the invention may implement combinations of the above aspects of the present invention, repetition of all steps or some of the steps in some of the above aspects of the present invention, and other configurations, structures and processes which have not been specifically set forth above. Further aspects of the invention will become apparent from a consideration of the drawings and the ensuring description of preferred embodiments of the present invention.

It is an advantage of one or some aspects of the invention to provide a multi-layer electrostatic energy harvester structure that can extract and convert more ambient vibration energy.

It is an advantage of one or some aspects of the invention to provide a multi-layer electrostatic energy harvester structure that can output more electric energy.

It is an advantage of one or some aspects of the invention to provide a multi-layer electrostatic energy harvester structure that has a larger capacitance.

It is an advantage of one or some aspects of the invention to provide a multi-layer electrostatic energy harvester structure that has a greater moving mass.

It is an advantage of one or some aspects of the invention to provide a multi-layer electrostatic energy harvester structure that has a higher actual achievable power density (AAPD).

It is an advantage of one or some aspects of the invention to provide a multi-layer electrostatic energy harvester structure that has less parasitic capacitance.

It is an advantage of one or some aspects of the invention to provide a multi-layer electrostatic energy harvester structure that can extract ambient vibration energy at a plurality of different frequencies or frequency ranges.

It is an advantage of one or some aspects of the invention to provide a multi-layer silicon fabrication method for forming multi-layer silicon-based electrostatic energy harvester structures, which is flexible and comprises simple and repetitive steps.

It is an advantage of one or some aspects of the invention to provide a fabrication method for forming a separate multi-material layer comprising silicon.

It is an advantage of one or some aspects of the invention to provide a fabrication method for forming a separate layer that comprises a plurality of discrete silicon features.

It is an advantage of one or some aspects of the invention to provide a fabrication method for embedding a material into a multi-layer silicon-based electrostatic energy harvester structure as a moving mass which has a density higher than silicon.

It is an advantage of one or some aspects of the invention to provide a fabrication method for forming a thicker anchor layer.

Further advantages of various aspects and embodiments of the present invention will be apparent to those of skill in the art upon review of the teachings herein. It should be noted that the various aspects of the invention may address one or more of the above advantages alone or in combination. It should be also noted that It is not necessarily intended that all advantages be addressed by any single aspect of the invention event though that may be the case with regard to some aspects.

BRIEF DESCRIPTION OF THE DRAWINGS

FIGS. 7A-7B schematically illustrate an AAPD comparison between a three-layer electrostatic energy harvester structure and an one-layer electrostatic energy harvester structure in the same given volumes wherein FIG. 7A shows the one-layer variable capacitor structure in the given volume and FIG. 7B shows the three-layer variable capacitor structure in the same given volume.

DETAILED DESCRIPTION OF PREFERRED EMBODIMENTS OF THE INVENTION

Figure 5:
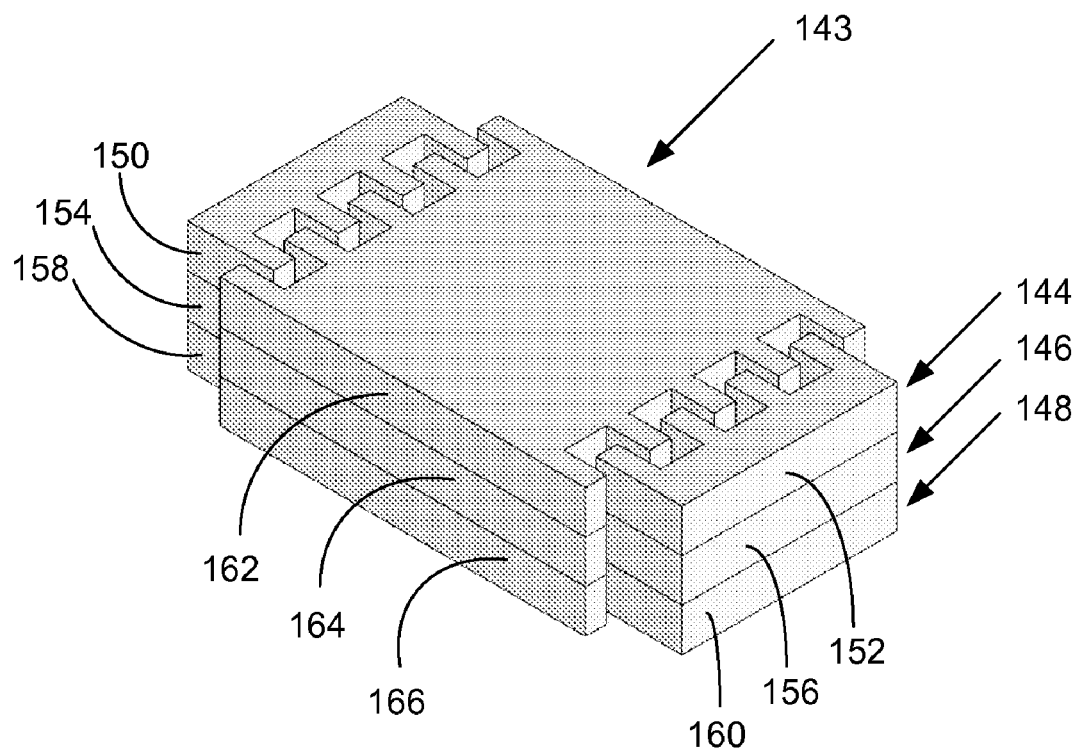
FIG. 5 schematically illustrates a perspective view of a first embodiment of a multi-layer electrostatic energy harvester structure that comprises three bonded identical variable capacitor layers.

FIG. 5 schematically illustrates a perspective view of a first embodiment of a multi-layer electrostatic energy harvester structure 143 that comprises three bonded variable capacitor layers 144 (top), 146 (middle), and 148 (bottom). In this embodiment, The three capacitor layers are made essentially of silicon. The three capacitor layer structures are essentially identical. Each capacitor layer comprises two fixed finger electrodes, one movable finger electrode (also as a moving mass), and two spring structures that are not shown and may have the spring structures shown in FIG. 1. Fixed electrodes 150, 152, 154, 156, 158, and 160 are for the capacitor layers 144, 146, and 148, respectively. Movable electrodes 162, 164, and 166 are for the capacitor layers 144, 146, and 148, respectively. Each movable electrode has two sets of fingers which form two variable comb capacitors with the two fixed electrodes on each capacitor layer. The fingers of each comb capacitor are arranged to be interdigitated. In this embodiment, although no spring structures are shown, those skilled in the art will understand that they can be designed so that each variable capacitor layer structure is either an in-plane constant gap comb capacitor type or an in-plane gap closing comb capacitor type.

Figure 1A:
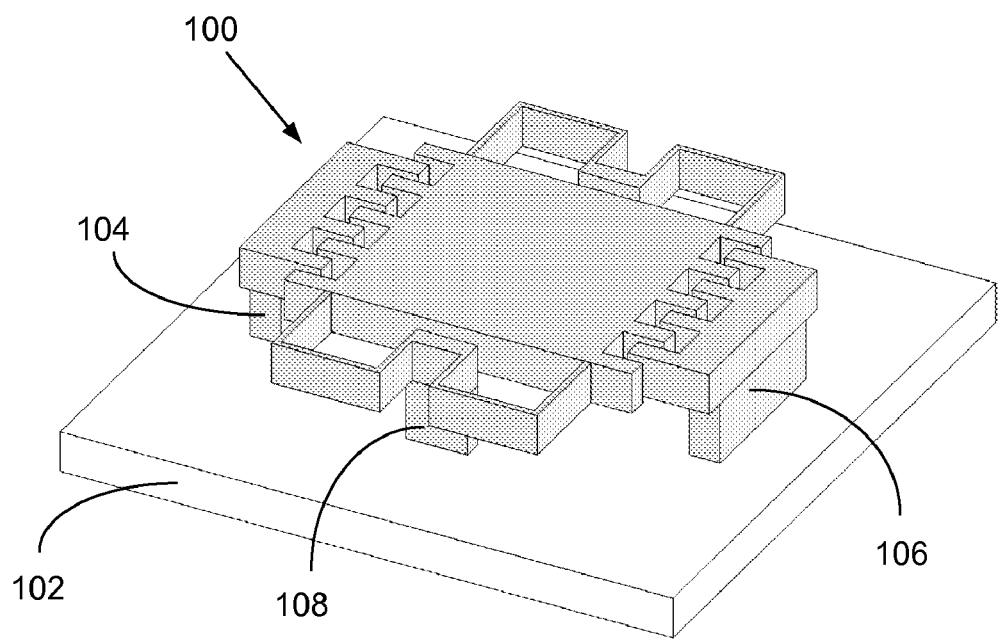
FIGS. 1A-1D schematically illustrates various views of an example of an one-layer in-plane comb capacitor type electrostatic energy harvester structure.
Figure 1B:
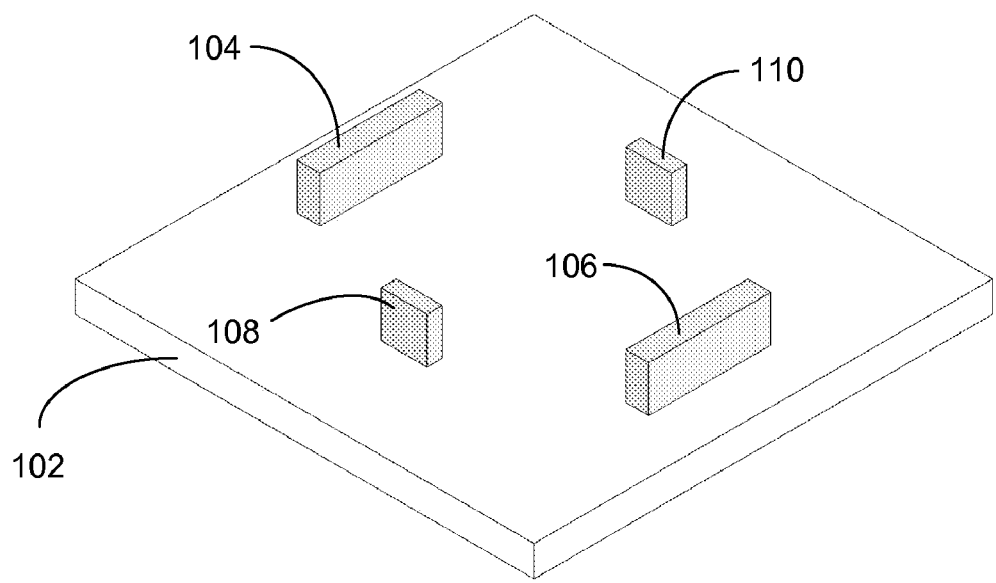
Figure 1C:
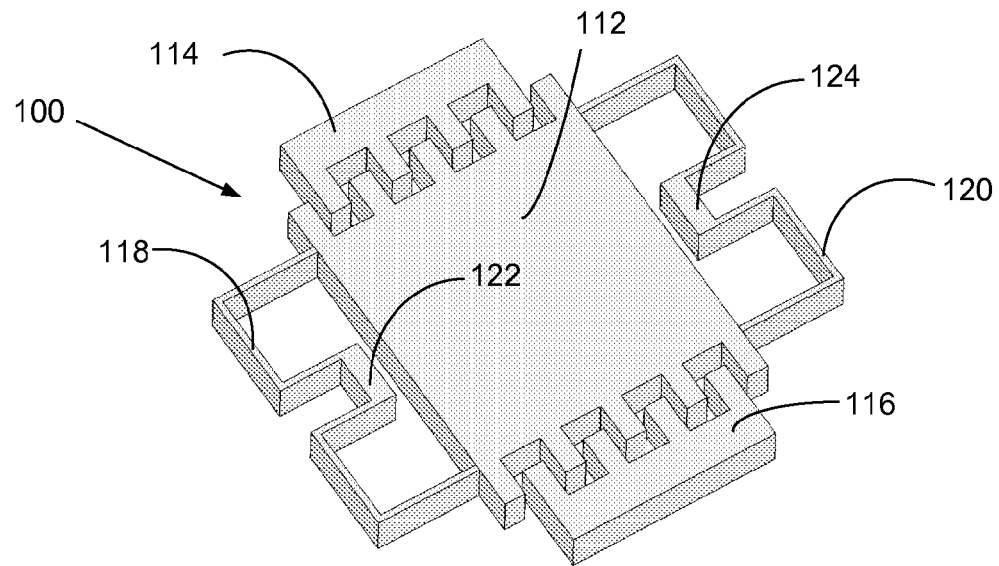
Figure 1D:
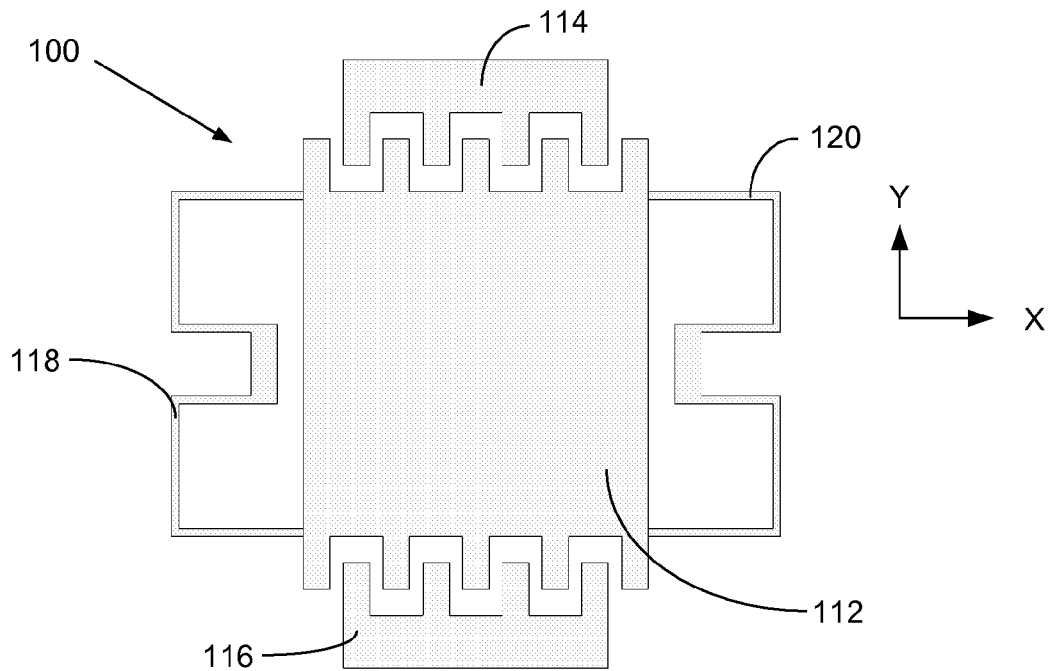
Figure 2:
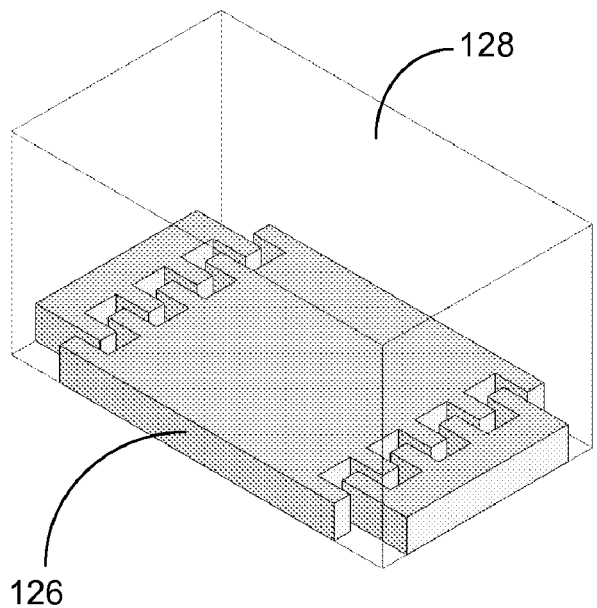
FIG. 2 schematically illustrates an one-layer comb capacitor type electrostatic energy harvester structure in a giving volume.
Figure 3:
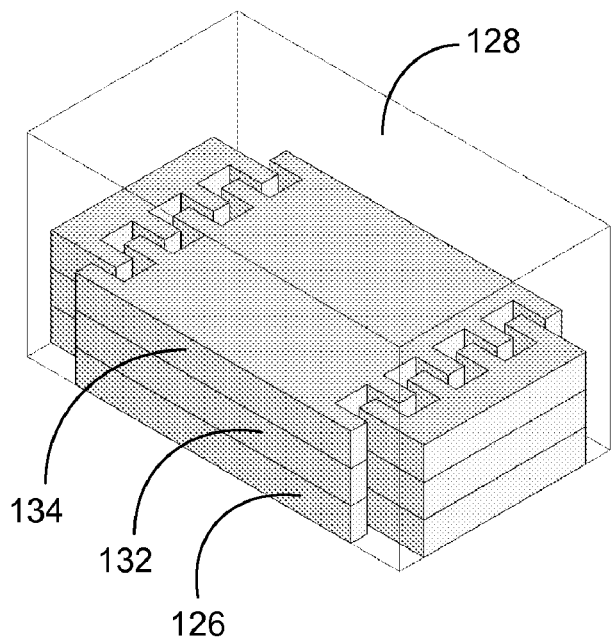
FIG. 3 schematically illustrates an electrostatic energy harvester structure comprising three identical one-layer comb capacitor structures in a giving volume.

Compared with currently available electrostatic energy harvesters with single variable capacitor layer (e.g., the examples shown in FIGS. 1 and 2), the energy harvester structure with three variable capacitor layers in this embodiment has larger capacitance, greater moving mass, bigger AAPD, and therefore higher converted power.

Those skilled in the art will understand that this embodiment may have alternatives or modifications. For example, a multi-layer energy harvester structure may have two or more than three variable capacitor layers. Each capacitor layer may be different (e.g. different thickness). Each capacitor layer may only comprise one fixed finger electrode, one movable finger electrode, and one spring structure to form only one variable comb capacitor. There may be further alternatives or modifications without actually departing from the spirit and scope of this embodiment.

Figure 6A:
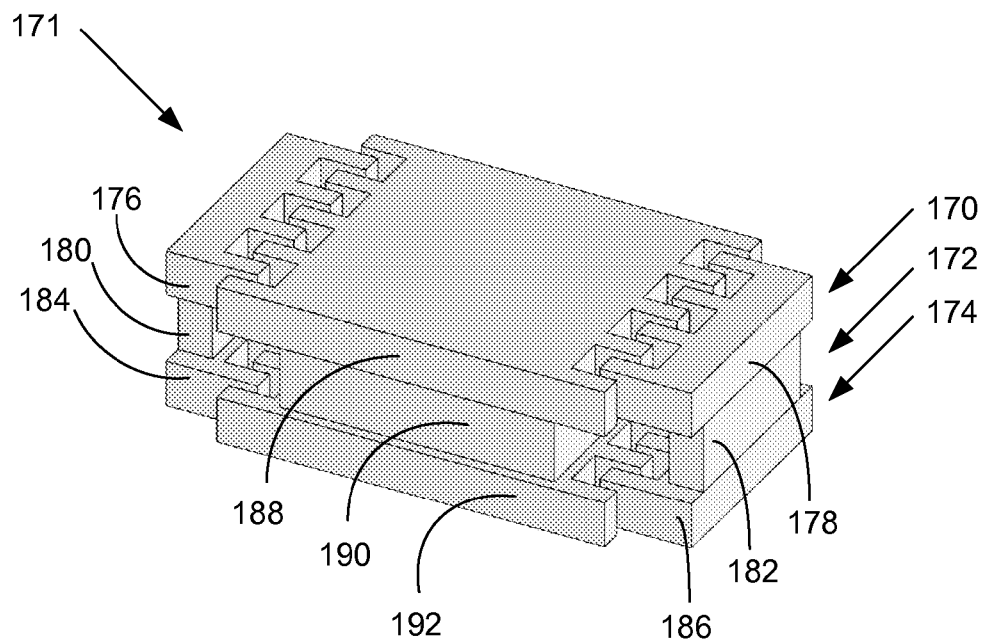
FIGS. 6A-6B schematically illustrate a second embodiment of a multi-layer electrostatic energy harvester structure that comprises three bonded layers: two identical variable capacitor layers and one moving mass layer.
Figure 6B:
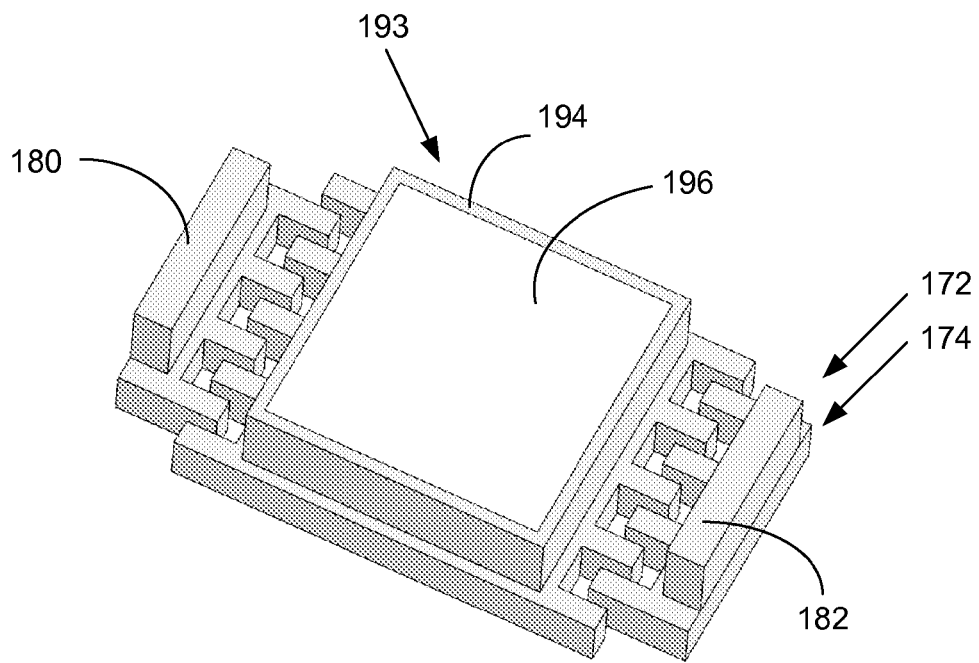

FIGS. 6A-6B schematically illustrate a second embodiment of a multi-layer electrostatic energy harvester structure 171. FIG. 6A shows a perspective view of the multi-layer harvester structure 171 that comprises three bonded layers 170 (top), 172 (middle), and 174 (bottom). The top and bottom layers (170 and 174) are two essentially identical variable capacitor layers. The middle layer 172 is a moving mass layer. The harvester structure 171 in this embodiment is similar to the harvester structure 143 in the first embodiment shown in FIG. 5 except the middle moving mass layer 172 replaces the middle variable capacitor layer 146. The two capacitor layers 170 and 174 have the same structures and material as the two capacitor layers 144 and 148 in FIG. 5. Fixed finger electrodes 176, 178, 184, and 186 are for the two capacitor layers 170 and 174, respectively. Movable electrodes 188 and 192 are for the two capacitor layers 170 and 174, respectively. In FIGS. 6A-6B, the spring structures of the harvester structure are not shown and may have the spring structures shown in FIG. 1.

FIG. 6B shows a perspective view of the moving mass layer 172 without the top layer 170. The moving mass layer comprises two connection components 180 and 182 and one moving mass component 193. The connection components 180 and 182 are made of silicon. The two fixed electrodes 176 and 184 are connected together via the connection component 180. The two fixed electrodes 178 and 186 are connected together via the connection component 182. The moving mass component 193 comprises an outside silicon frame 194 and a material 196 that is embedded in the silicon frame. The function of the moving mass component 193 is to increase the total moving mass weight of the harvester structure 171. The material 196 is therefore preferably to have a density greater than silicon. For example, the material 196 may be silver or gold. The center of the moving mass component 193 is preferred to essentially coincide with the centers of the movable electrodes 188 and 192.

Figures 7A, 7B:
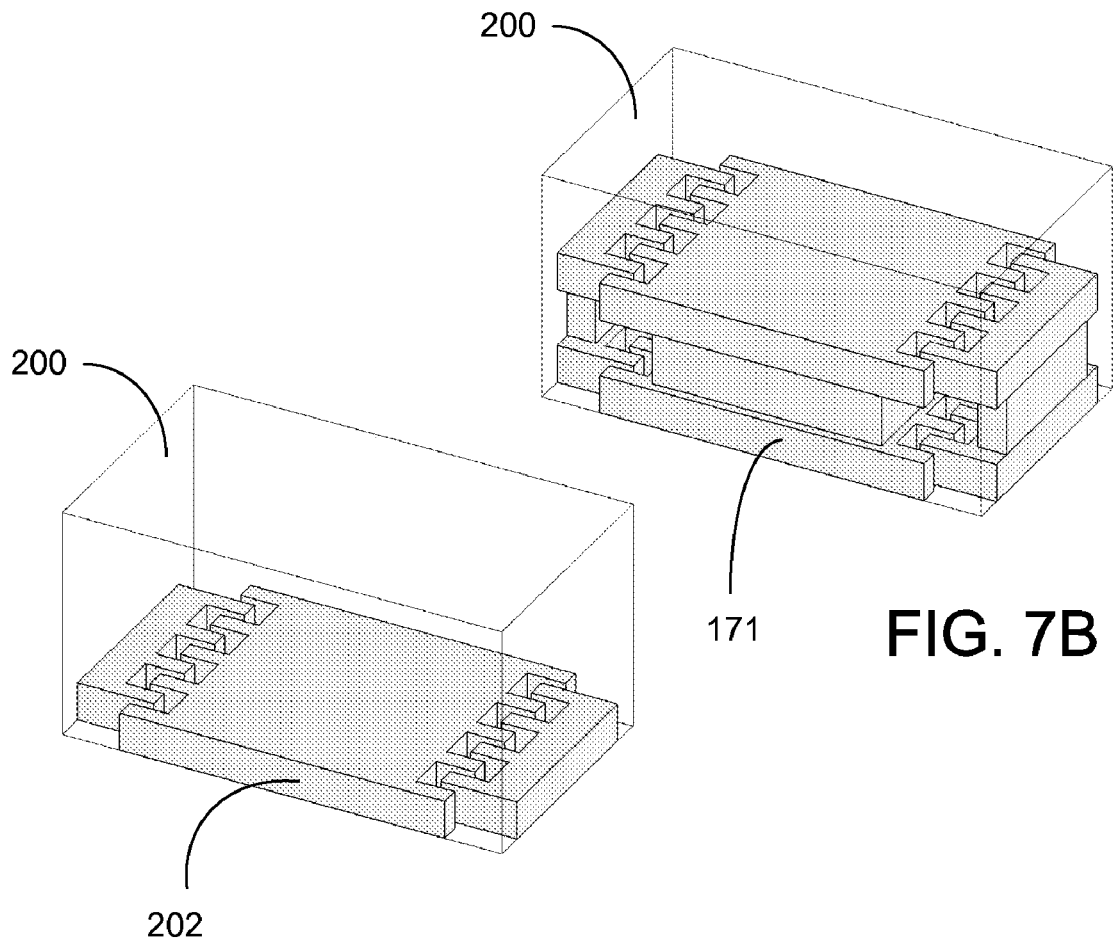

The three-layer structure 171 in this embodiment offers several significant advantages over a single-layer harvester structure made with DRIE. FIGS. 7A-7B schematically illustrate their volume usage ratios ($V_h/V_a$) in the same volume 200. FIG. 7A shows a single-layer harvester structure 202 that is identical to the variable capacitor layers 170 and 174 of the harvester structure 171. The single-layer structure 202 only occupies a portion of the given volume 200, meaning a low AAPD and therefore a low converted power in terms of this volume. FIG. 7B shows the three-layer structure 171 in the same volume 200. Compared with the single-layer structure, the three-layer structure has higher AAPD, larger capacitance, and much greater converted power. For example, assume that the thickness of the all variable capacitor layers is 200 μm. As the middle moving mass layer of the three-layer structure does not have comb structures, its thickness is allowed to be much thicker, e.g., 500 μm for this comparison purpose. Therefore, the volume usage ratio of the three-layer structure is 4.5 times as much as that of the single-layer structure. The capacitance of the three-layer structure is two times larger than that of the single-layer structure. If gold is the material 196 in the middle moving mass layer of the structure 171, from a moving mass point view, the three-layer structure could covert vibration energy up to 20 times greater than the single-layer structure.

Figure 8A:
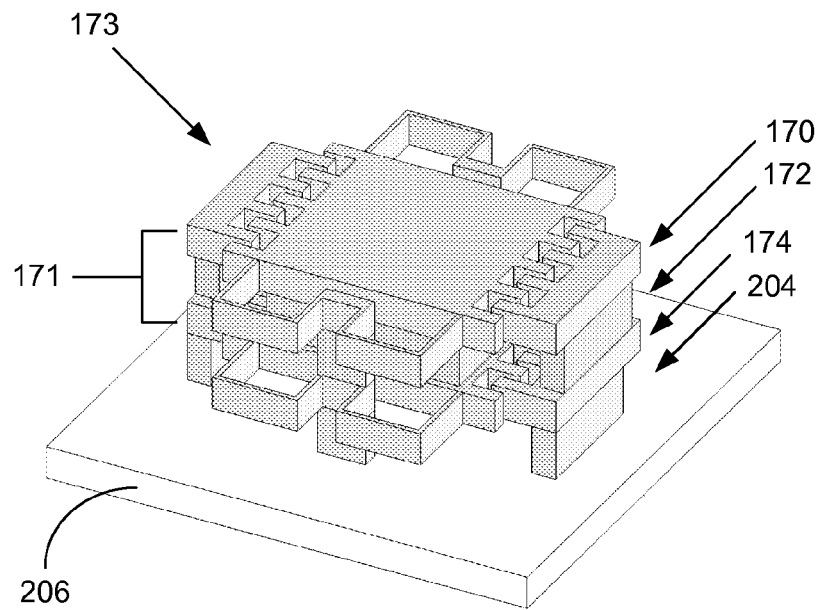
FIGS. 8A-8B schematically illustrate a perspective view (FIG. 8A) and a layer decomposition view (FIG. 8B) of the three-layer energy harvester structure shown in FIGS. 6A-6B with more structure components comprising a substrate, anchor components, connection components, and spring structures.
Figure 8B:
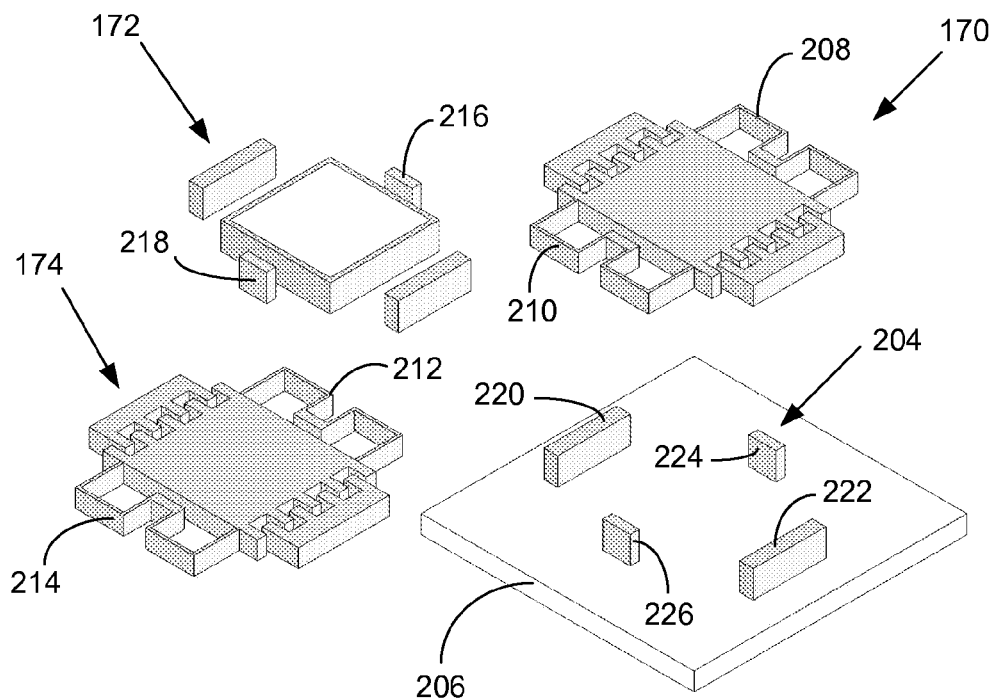

FIGS. 8A and 8B schematically illustrate a perspective view (FIG. 8A) and a layer decomposition view (FIG. 8B) of a multi-layer electrostatic energy harvester structure 173 that is an extension of the three-layer energy harvester structure 171 and comprises the structure 171 and other structure components.

Each of the two variable capacitor layers 170 and 174 has two spring structures, i.e., spring structures 208 and 210 for the layer 170 and spring structures 212 and 214 for the layer 174. The spring structures are made essentially of silicon and are designed so that the variable capacitor structure 170 and 174 are in-plane constant gap comb capacitor type. The spring structures 210 and 214 are connected together via a connection component 218 on the middle moving mass layer 172 to form a multi-layer spring structure. The spring structures 208 and 212 are connected together via a connection component 216 on the middle moving mass layer 172 to form a multi-layer spring structure. The two connection components 216 and 218 are also made essentially of silicon.

An anchor layer 204 secured to a substrate 206 has four anchor components 220, 222, 224 and 226. The anchor components 220 and 222 support the two multi-layer fixed electrodes of the structure 171 above the substrate. The anchor components 224 and 226 support the two multi-layer spring structures that suspend the multi-layer movable electrodes of the structure 171 above the substrate. Material of the four anchor components 220, 222, 224 and 226 may be silicon or silicon dioxide. Material of the substrate may be silicon, silicon with a silicon dioxide layer on its top surface, or glass.

Figure 9:
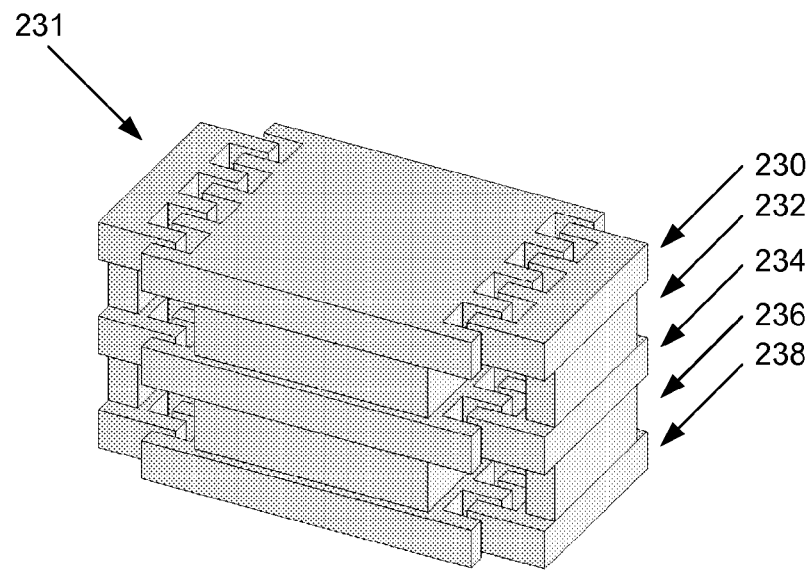
FIG. 9 schematically illustrates a perspective view of a five-layer electrostatic energy harvester structure comprising three variable capacitor layers and two moving mass layers, which is an extension of the three-layer energy harvester structure shown in FIGS. 6A-6B.
Figures 10A, 10B:
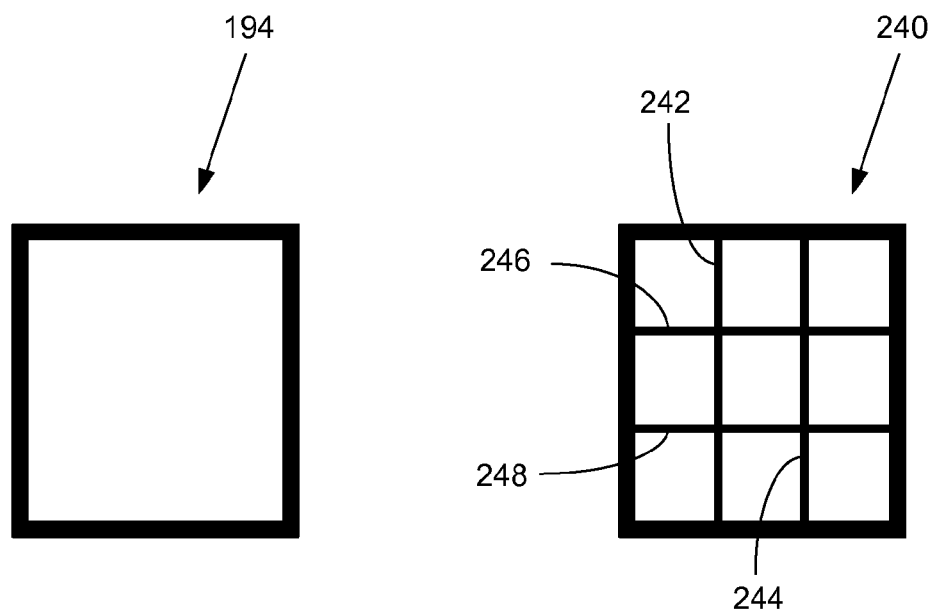
FIG. 10A schematically illustrates a plan view of the frame structure shown in FIG. 6B.
FIG. 10B schematically illustrates a plan view of a variation of the frame structure shown in FIG. 10A, which comprises four enhanced ribs.

Those skilled in the art will understand that this embodiment may have alternatives or modifications. For example, a multi-layer electrostatic energy harvester structure may have more variable capacitor layers and/or more moving mass layers. FIG. 9 schematically illustrates an electrostatic energy harvester structure 231 comprising three variable capacitor layers (230, 234, and 238) and two moving mass layers (232 and 236). If the capacitor layers and the moving mass layers of the structure 231 are identical to those of the structure 171, the structure 231 will extract and convert more vibration energy into electric energy than the structure 171. The variable capacitor layers and moving mass layers may be arranged to be alternate as the structures 171 and 231 or to be other desired patterns. The frame 194 in FIG. 6B may be other shapes such as a circular or ring shape. The frame 194 may comprise other silicon features. For example, FIG. 10A schematically illustrates a plan view of the frame 194 without other features. FIG. 10B schematically illustrates a plan view of a frame 240 that is a variation of the frame 194 and comprises four enhanced ribs 242, 244, 246, and 248. The moving mass component 193 in FIG. 6B may comprise only the frame 194 without the embedded material 196 or may be just a piece of solid silicon without cavities or through holes. Each capacitor layer may be different (e.g. different thickness). Each capacitor layer may only comprise one fixed finger electrode, one movable finger electrode, and one spring structure to form only one variable comb capacitor. There may be further alternatives or modifications without actually departing from the spirit and scope of this embodiment.

Figure 11:
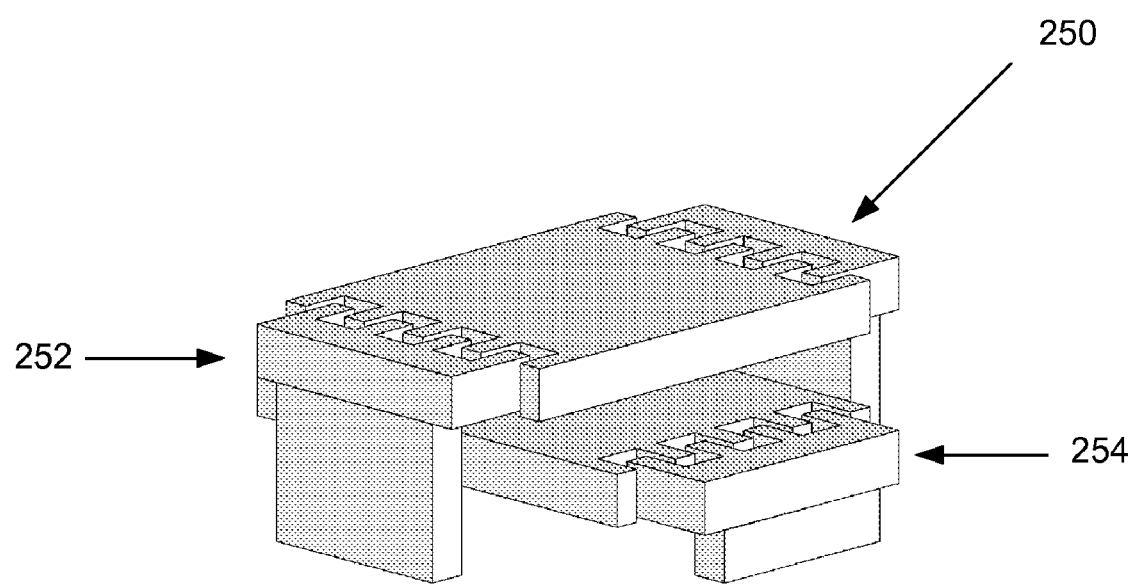
FIG. 11 schematically illustrates a perspective view of a third embodiment of a multi-layer electrostatic energy harvester structure that comprises two separate variable capacitor layers with their anchor components.

FIG. 11 schematically illustrates a third embodiment of a multi-layer electrostatic energy harvester structure 250 that comprises two separate variable capacitor layers 252 and 254. The capacitor layer 252 is above the capacitor layer 254. Their orientation is essentially orthogonal. These two capacitor layers are independent and do not have mechanical connections between them. The structure 250 can be viewed as a combination of two independent single-layer energy harvester structures that have similar structures to the single-layer structure 100 in FIG. 1. Both capacitor layers are made essentially of silicon. Each of the capacitor layers is anchored to a substrate (not shown) via anchor components (partially shown). Spring structures of both capacitor layers are not shown in FIG. 11 and may have the same spring structures shown in FIG. 1. The spring structures are also anchored to the substrate via anchor components (not shown and may refer to FIGS. 1A-1B). Again, their spring structures may be designed so that each of the capacitor layers may be an in-plane constant gap comb capacitor type or an in-plane gap closing comb capacitor type. As vibrations are not constant, an energy harvester is desired to work in a wide frequency range. In this embodiment, as the two capacitor layers are independent, if the two comb capacitor layers are designed to be resonate at two different frequencies, an energy harvester comprising this structure 250 can extract and convert vibration energy at two different frequencies or frequency ranges.

Those skilled in the art will understand that this embodiment may also have alternatives or modifications. For example, a multi-layer electrostatic energy harvester structure may comprise more separate variable capacitor layers. The variable capacitor layers may have the same or different structures. Each variable capacitor layer may comprise one or more comb capacitors. Relative positions and orientations of the variable capacitor layers may be patterned as desired. One, some, or all of the variable capacitor layers may have an extra moving mass component attached on their movable electrodes. There may be further alternatives or modifications without actually departing from the spirit and scope of this embodiment.

The multi-layer electrostatic energy harvester structures disclosed in this patent may be formed with a multi-layer fabrication technique called Assemblayer™ invented by the present inventor. This technique can form multi-layer structures (e.g., parts, components, devices, and the like) by separately fabricating a plurality of individual layers and/or individual groups of layers of fabrication materials and then attaching them together. The various fabrication methods of this technique were disclosed in U.S. Non-Provisional patent application Ser. No. 11/278,137 filed Mar. 30, 2006, U.S. Non-Provisional patent application Ser. No. 11/548,207 filed Oct. 10, 2006, and U.S. Non-Provisional patent application Ser. No. 11/855,906 filed Sep. 14, 2007 by the present inventor. These three applications are hereby incorporated herein by reference as if set forth in full herein. When Assemblayer™ is used to fabricate structures comprising silicon, the resulting manufacturing process is called Si-Assemblayer™.

An example of using the Si-Assemblayer™ technique for forming a multi-layer silicon structure is illustrated in FIGS. 12A-12I that schematically depict side views at various stages of a process for forming a multi-layer silicon structure by forming and attaching individual single layers.

Figure 12A:
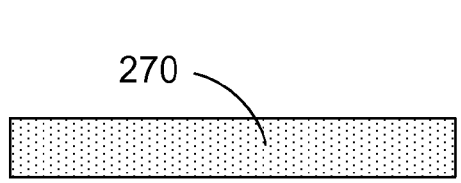
FIGS. 12A-12I schematically depict side views at various stages of a process for forming a multi-layer silicon structure by forming and attaching individual single layers, and removing sacrificial material.
Figure 12B:
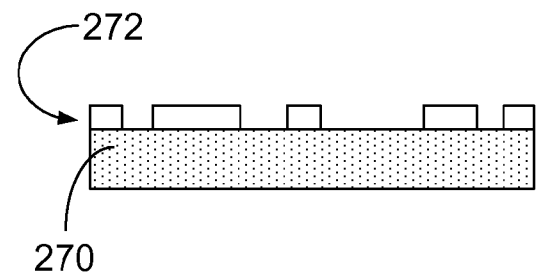
Figure 12C:
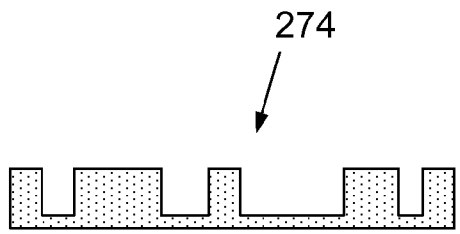
Figure 12D:
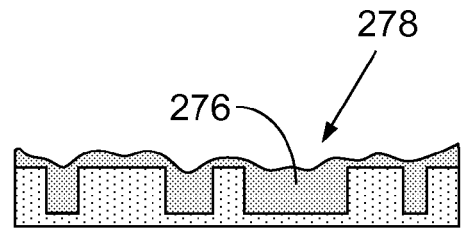
Figure 12E:
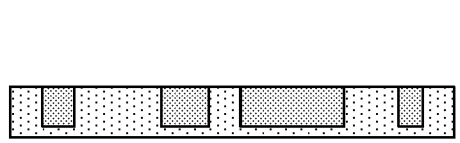
Figure 12F:
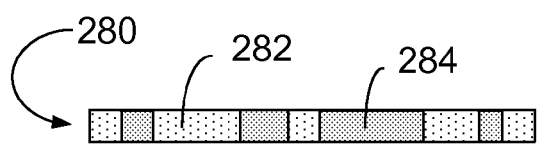
Figure 12G:
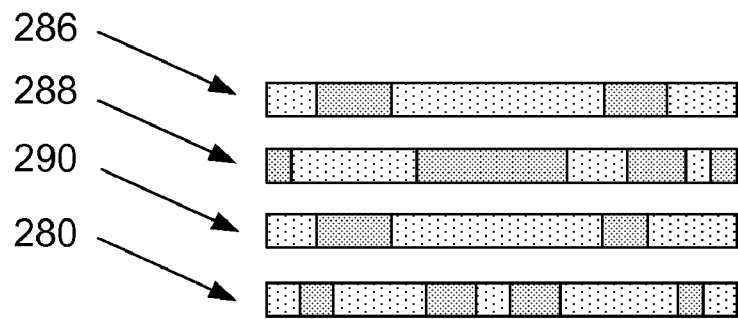
Figure 12H:
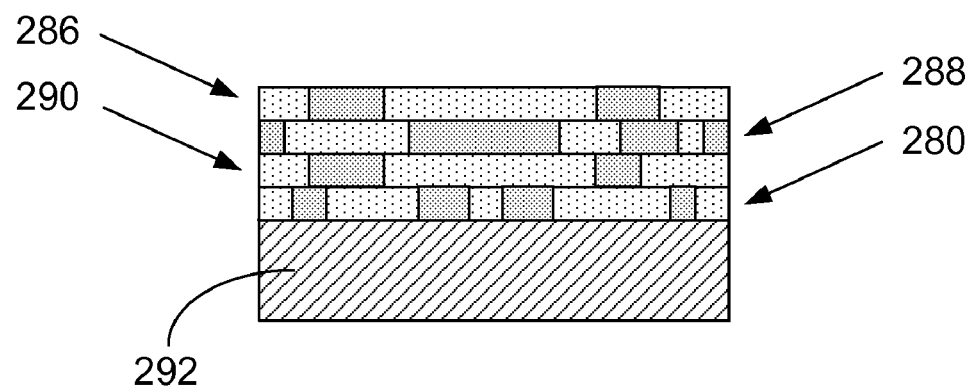

FIGS. 12A-12F schematically illustrate various stages for making a individual single layer comprising discrete silicon features. FIG. 12A shows a silicon wafer 270. FIG. 12B shows that a DRIE mask 272 such as a photoresist or a layer of silicon dioxide has been patterned on the silicon wafer. Then the exposed portion of the silicon wafer is etched to a desired depth to form a silicon mold 274 shown in FIG. 12C by using DRIE, laser etching, wet etching, or the like. In FIG. 12D, a sacrificial material 276 is filled into the silicon mold to form a two-material layer 278. For example, a metal may be electrodeposited into the silicon mold. The top and bottom surfaces of the two-material layer 278 are planarized so that both materials are exposed; both surfaces reach desired flatness and smoothness; and the layer thickness reaches a predetermined value. The planarization result of the top surface is shown in FIG. 12E. The planarization result of the bottom surface is shown in FIG. 12F. A formed desired layer 280 is shown in FIG. 12F. The layer 280 has silicon features 282 and sacrificial material features 284. The sacrificial material 284 functions as an "adhesive" which holds the discrete silicon features 282 together. The process steps shown in FIGS. 12A-12F are repeated to build all required single layers for a multi-layer silicon structure. The result is shown in FIG. 12G where four individual single layers 286, 288, 290, and 280 have been formed, each of which comprises silicon and the same sacrificial material. These four layers are then oriented, aligned, stacked and bonded together to form a multilayer silicon structure with a proper silicon bonding technology. FIG. 12H shows that all the four layers are bonded to a permanent substrate 292. The sacrificial material is then etched to form a final structure 298 shown in FIG. 12I. Note that after the sacrificial material removal operation, sacrificial material 296 is still left in the structure 298 as it is sealed in a closed cavity after all the layers are bonded together.

The disclosed multi-layer electrostatic energy harvester structures can be decomposed into a plurality of individual single layers. For example, the multi-layer harvester structure 173 in FIGS. 8A-8B can be decomposed into five layers including the substrate. Therefore, the Si-Assemblayer™ process shown in FIGS. 12A-12I is suitable to make the disclosed harvesters made of silicon.

Figure 4:
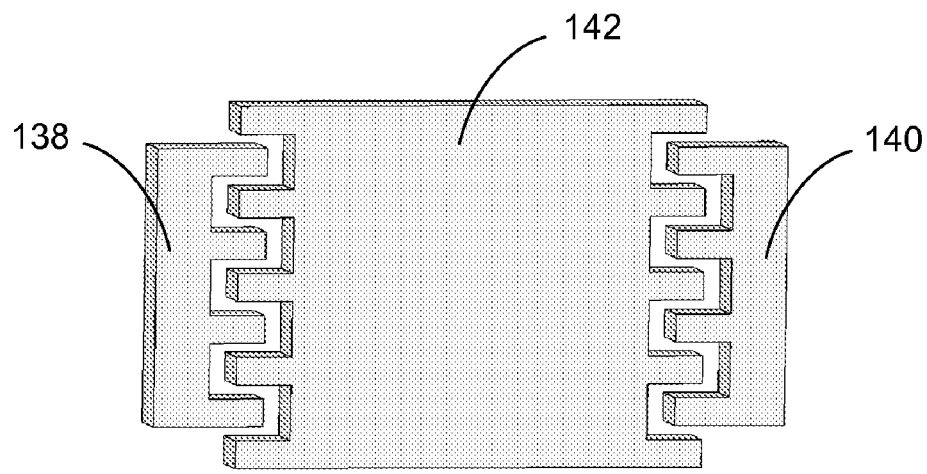
FIG. 4 schematically illustrates a variable capacitor layer comprising three discrete features: two fixed electrodes and one movable electrode.

As currently available silicon microfabrication technologies cannot make layers comprising discrete silicon features such as the capacitor layer example shown in FIG. 4, one advantage of the Si-Assemblayer™ fabrication process is that layers comprising discrete silicon features can be easily made, which makes it possible to realize complex silicon structures. This is because of using sacrificial material to temporarily bond discrete silicon features together so that a layer comprising these features can then be formed.

Figure 12I:
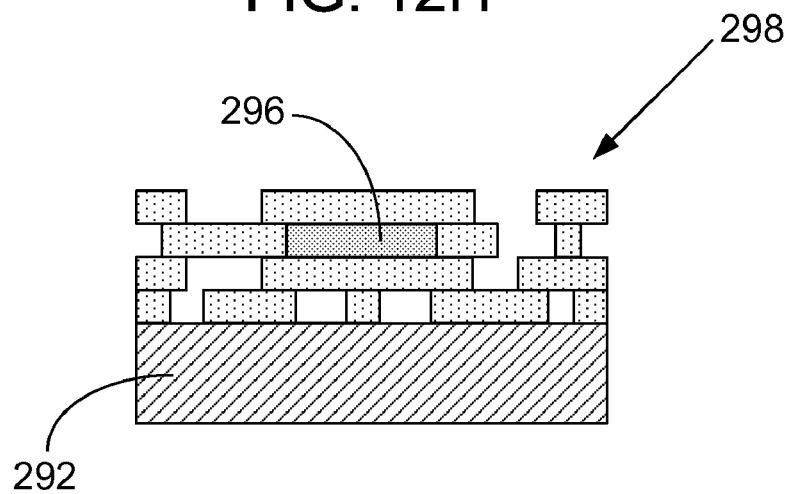

Another advantage of the Si-Assemblayer™ fabrication process is that it can easily embed a foreign material such as a metal into a multi-layer silicon structure in the same process. This is especially useful for silicon electrostatic harvester structures that require a high-density material as a portion of a moving mass. FIG. 12I shows one example where a portion of the sacrificial material is sealed in a silicon cavity so that it is left in the multi-layer silicon structure while the rest of the sacrificial material is etched away. In this example, the material sealed in the cavity is the same as the sacrificial material. However, it could be a material other than the sacrificial material.

Still another advantage of the Si-Assemblayer™ fabrication process is that it can fabricate a multi-layer electrostatic harvester structure with a thicker anchor layer. For conventional single-layer silicon-based electrostatic energy harvesters made with DRIE such as the example shown in FIG. 1, they are usually fabricated from SOI (silicon-on-insulator) wafers. An SOI wafer is a sandwich structure which has a silicon dioxide ($SiO_2$) layer in between two silicon wafer layer. One silicon wafer layer is machined to be a single-layer variable capacitor layer. The other silicon wafer layer serves as a substrate. The middle silicon oxide layer is machined to be an anchor layer which supports the variable capacitor layer above the substrate layer. However, the silicon dioxide layer is thin, which has a thickness only up to few microns. Therefore, the separation (i.e., the thickness of the anchor layer) between the capacitor layer and the substrate is small. This small separation will introduce parasitic capacitance. With the Si-Assemblayer™ fabrication process, an anchor layer may be made separately using a silicon layer with a desired thickness. Or if an SOI wafer is used, one silicon wafer layer can be machined to be an anchor layer. The other silicon wafer and the middle silicon oxide layer act as a substrate. Therefore, the limitation of the anchor layer thickness can be eliminated.

In order that those skilled in the art will be better able to practice the present invention, the fabrication of the silicon-based multi-layer energy harvester structure 173 in FIGS. 8A-8B with the Si-Assemblayer™ technique is depicted as follows, which is given by way of illustration and not by way of limitation.

The multi-layer structure 173 comprises four structure layers (170, 172, 174, and 204) and one substrate 206. The two capacitor layers (170 and 174) are identical. The layers 170, 172, and 174 are made of silicon. The layer 204 may be made of silicon, silicon dioxide, or glass. If the layer 204 material is silicon, the substrate 206 may be glass or silicon with a silicon dioxide on silicon top surface. One convenient way is to use an SOI wafer. With an SOI wafer, we can directly machine one of two silicon layers to form a layer 204 that is on a silicon dioxide layer that is on the other silicon layer. Alternatively, we can separately build a layer 204. Then bond it to a silicon wafer with a layer of silicon oxide on its top surface. Silicon dioxide is an insulating material. Its function is to electrically separate an energy harvester structure from its substrate. Alternatively, the built layer 204 may also be bonded to a glass. If the layer 204 material is silicon dioxide, we can first deposit a layer of silicon dioxide on a silicon wafer or on a glass wafer. Then pattern the formed silicon dioxide layer to form a layer 204 with, e.g., photolithography and etching. If the layer 204 material is glass, it may be fabricated directly from a glass wafer by using, e.g., photolithography and etching. The function of the layer 204 is to support the multi-layer harvester structure 171 (i.e., the layers 170, 172, and 174) so that the multi-layer movable electrode of the harvester structure can move with vibrations above the substrate.

In this example, the layers 170, 172, and 174 are fabricated with the Si-Assemblayer™ technique. The layer 204 is directly formed by etching the device layer (i.e., one of two silicon layers) of an SOI wafer with DRIE. Then the three layers 170, 172, and 174 and the machined SOI wafer comprising the anchor layer 204 and the substrate 206 are bonded together and a sacrificial material is then be etched to release the harvester structure. The detailed process steps are described as follows.

Figure 13A:
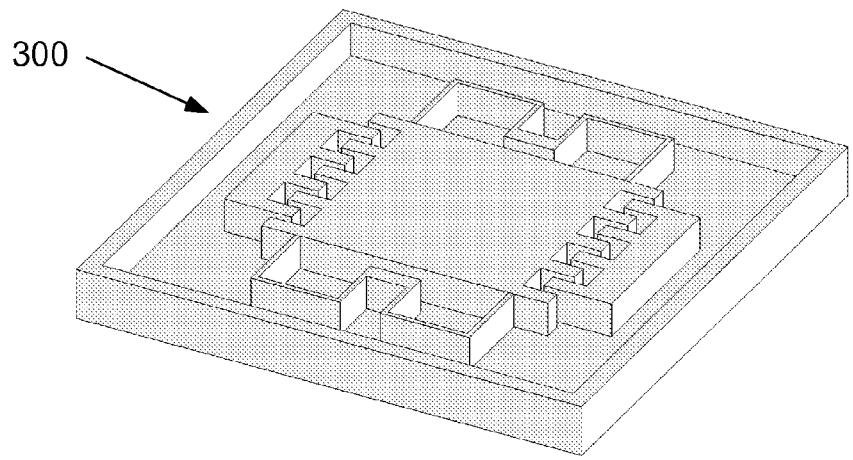
FIG. 13A schematically illustrates a perspective view of a formed silicon mold for the formation of a variable capacitor layer after DRIE.
Figure 13B:
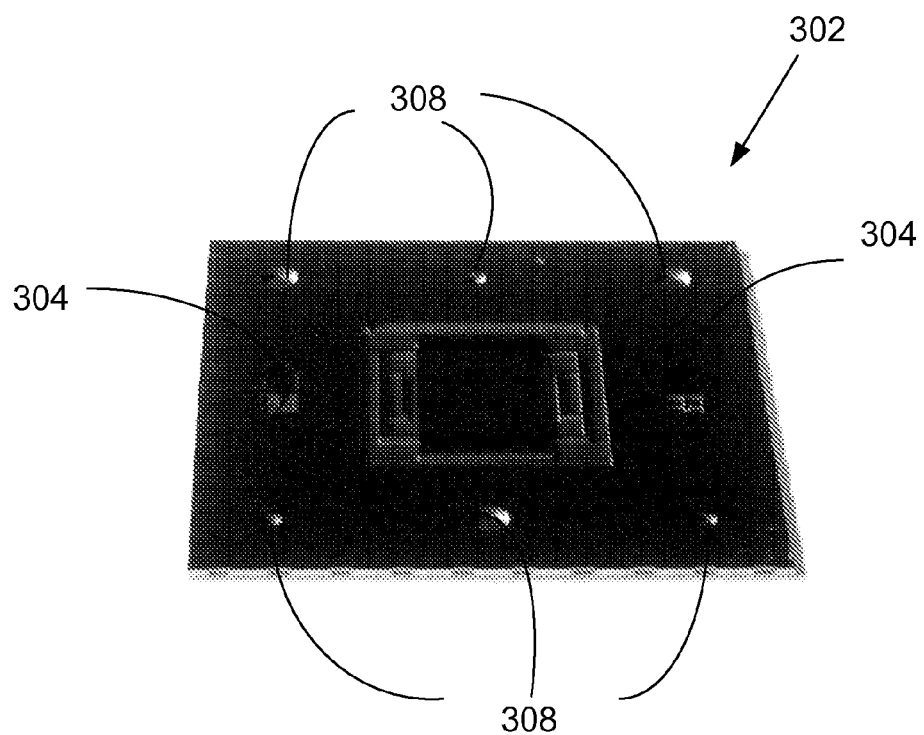
FIG. 13B shows a photo image of a real silicon mold for the formation of a variable capacitor layer after DRIE, which also comprises two optical alignment marks and six mechanical alignment locating holes.

DRIE is used for etching three silicon wafers to make three silicon molds for the formation of the layers 170, 172, and 174. DRIE is also used for etching the device layer of an SOI wafer to form the layer 204. For DRIE, we first form and pattern a layer of photoresist (e.g., AZ 4620 or SU-8) or a layer of $SiO_2$ on a silicon wafer as a DRIE mask. Photoresist application and patterning are standard MEMS processes. Silicon dioxide deposition and patterning are also standard MEMS processes. Then we place the patterned silicon wafer into a DRIE machine to selectively etch the exposed silicon to a predetermined depth (not through the wafer). DRIE is a standard silicon micromachining process. FIG. 13A schematically illustrates a perspective view of a formed silicon mold 300 for the formation of the layer 170 after DRIE. FIG. 13B shows a photo image of a real formed silicon mold 302 after DRIE. Note the mold 302 also comprises two optical alignment marks 304, and six mechanical alignment locating holes 308.

Normal silicon microfabrication involving DRIE suffers from at least two drawbacks. The DRIE etch rate distributes non-uniformly both locally and globally over a silicon wafer depending on feature geometry and feature distribution. Although the etching parameters of DRIE can be adjusted to an extent to lessen this effect, this non-uniformity cannot be avoided. In addition, after DRIE, one has to accept as-is for both etched depth non-uniformity and etched surface smoothness as there does not exist a post-treatment process for improving the non-uniformity and smoothness. However, these two drawbacks can be easily overcome and compensated with the Si-Assemblayer™ technique. This is because in Si-Assemblayer™ we only need to produce solid single layers prior to bonding. These solid layers can be post-treated to reach precise thickness and desired surface flatness, smoothness and cleanliness. Therefore, even DRIE causes a non-uniform etch depth distribution, this non-uniformity can be removed in the step of planarization (see description below) as long as the minimum etch depth reaches the requirement. This is one significant advantage of Si-Assemblayer™ over standard bulk micromachining plus silicon bonding for forming complex silicon microstructures.

Although in this example, we use DRIE to etch silicon. Alternatively, we may also use laser etching, wet etching, or the like to process silicon.

After DRIE, a sacrificial material is filled into the formed three silicon molds for forming the layers 170, 172, and 174. The sacrificial material will hold discrete silicon features together on the layers 170, 172, and 174. FIG. 8B schematically shows the discrete silicon components on the three layers. Without a sacrificial material, these three separate layers cannot be made. Note that for the layer 204, its four discrete anchor components are formed on the SOI wafer that supports these discrete components.

There are many ways to fill a sacrificial material into a silicon mold. For example, we may deposit a metal into a silicon mold. For example, we may electroplate copper into a silicon mold. Electrodeposition is a low cost manufacturing approach for the fabrication of metal microstructures and is widely used in the MEMS industry. The electrodeposition of metals into silicon molds is also a common practice. Copper is one of the most popular platable metals in electrodeposition. In addition, there are copper etchants which are compatible with silicon.

To deposit copper into a silicon mold, the silicon mold needs to be metalized prior to copper plating. Metallization not only provides a conductive or seed layer for plating, but also provides an adhesion layer to increases the adhesion between silicon and copper. Vacuum deposition is usually used to deposit thin seed and adhesion layers (e.g., Ti/Cu, Cr/Cu) on silicon with an e-beam deposition system. Alternatively, we may use electroless copper plating to plate a layer of copper on silicon as a seed layer for the following copper electroplating.

We may also fill a polymer material into a silicon mold. For example, we may pour a liquid epoxy into a silicon mold. One suitable epoxy is Epo-Tek 301 (Epoxy Technology, Inc.). This epoxy has a quite low viscosity (100-200 cPs) and can be easily filled into a silicon mold. It adheres well on silicon. In addition, it can be planarized with lapping and polishing. It can be removed without damaging silicon.

Prior to epoxy filling, a silicon mold is first cleaned, e.g., in a piranha solution at 80° C. for 15 min. The piranha solution is a mixture of 4:1 (volume ratio) concentrated sulfuric acid to 30% hydrogen peroxide solution. The steps for filling the Epo-Tek 301 epoxy into the silicon mold after cleaning includes: 1) thoroughly mixing the two parts of the epoxy; 2) applying the mixed epoxy into the silicon mold; 3) degassing the epoxy to remove air bubbles; and 4) curing the epoxy at room temperature (20-30° C.) for 24 hours. Note that the curing temperature is crucial to minimize the stress on the two-material (Silicon-epoxy) layer. Though this epoxy can be cured at a higher temperature for less curing time (e.g., 65° C. for 1 hour), the thermal stress induced by the mismatch in the coefficient of thermal expansion between silicon and epoxy can deform the two-material layer when the layer cools down from the curing temperature. However, with room temperature curing of the epoxy no noticeable stress on the two-materials layer is found.

We may also fill nano- or micro-particles of a material into a silicon mold and then to fire the particles to bond between the particles themselves and the particles and the silicon mold together. For example, we may fill silver or gold nano- or micro-particles into a silicon mold. For one practical application of this method, silver or gold particles are mixed with suitable binders and water to form a desired clay or paste that is then used to be filled into the silicon mold. There are several commercial silver and gold paste or clay products on the market. For example, we may use a silver paste, ACS 650 Paste made by Aida chemical industries Co., Ltd. and a gold clay, PMC Gold Clay made by Mitsubishi Materials Corporation to fill into a silicon mold. Both the silver and the gold adhere on silicon very well after firing.

Using silver or gold has an advantage for the electrostatic energy harvester structures disclosed in this invention. The converted power is proportional to the moving mass of a harvester structure. Attaching a high-density material is highly desirable. This is exactly the function of the layer 172 (the moving mass layer) in the harvester structure 171. Compared with silicon (2.33 $g/cm^3$) and copper (8.92 $g/cm^3$), silver or gold has a higher density (Ag: 10.49 $g/cm^3$ and Au: 19.3 $g/cm^3$), meaning higher power output.

Prior to silver filling, a silicon mold is first cleaned up, e.g., in the piranha solution at 80° C. for 15 min. The silver filling process is quite simple. Although there are many variations (e.g., different drying and firing temperatures and time), it includes the following steps:

(1) adjust the ACS 650 silver paste to a desired thickness with water;
(2) apply a proper amount of the silver paste to the desired places of the silicon mold;
(3) dry the silver paste on the silicon mold at 180° C. on a hotplate for 30 min;
(4) put the silicon mold with the silver paste into a furnace;
(5) set a firing temperature at 650° C. and turn on the furnace;
(6) when the furnace temperature reaches 650° C., hold for 30 min; and
(7) turn off the furnace and cool down the furnace to the room temperature.

Figure 14:
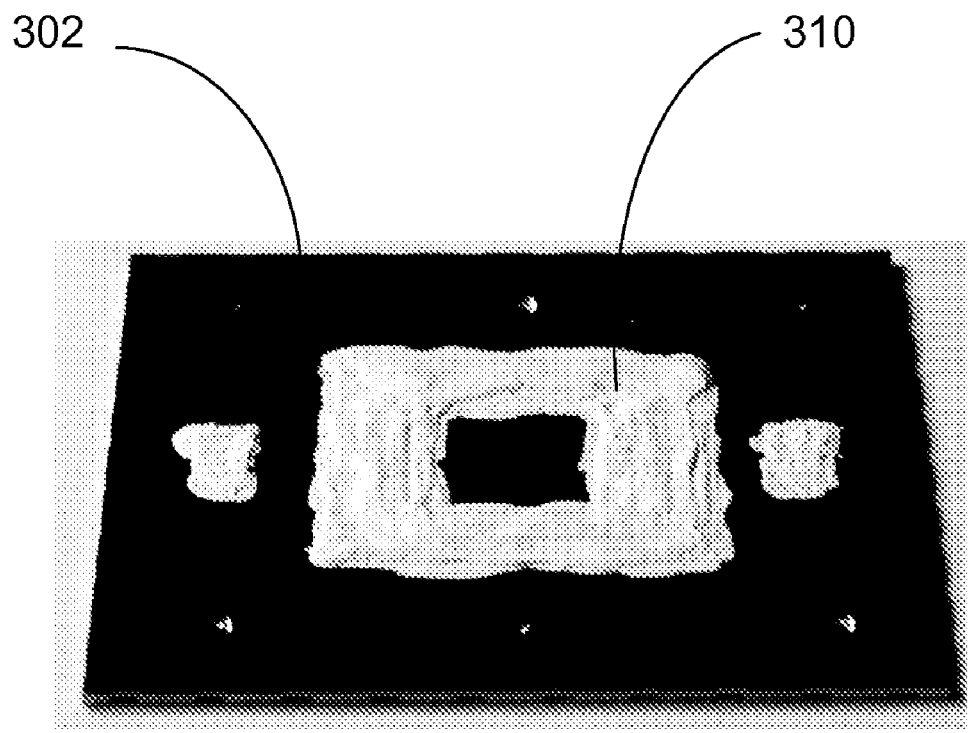
FIG. 14 shows a photo image of the real silicon mold shown in FIG. 13B, which is filled with silver as a sacrificial material.

FIG. 14 shows a photo image of the real silicon mold 302 shown in FIG. 13B filled with silver 310 after filling and firing the ACS 650 silver paste. Note that silver can be used as both a sacrificial material and a moving mass. In FIG. 14, the silver 310 is used as a sacrificial material as its function is to bond the discrete silicon features.

Figure 15A:
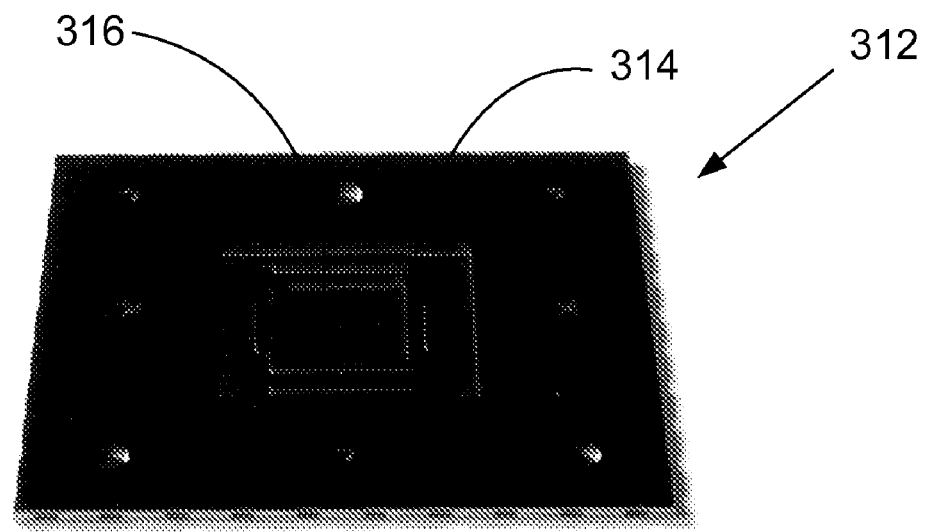
FIG. 15A shows a photo image of a real silicon mold for the formation of a moving mass layer, which comprises a silicon frame in the center inside which is a cavity for being filled with a desired moving mass material.
Figure 15B:
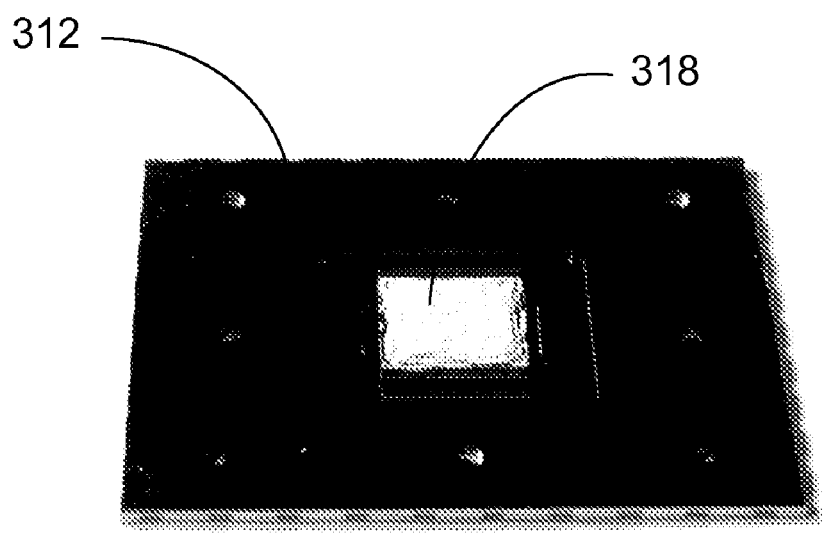
FIG. 15B shows a photo image of the silicon mold shown in FIG. 15A in which the cavity is filled with gold as a moving mass.

For gold filling, PMC Gold Clay may be filled into a silicon mold. The steps of filling gold into a silicon mold is similar to the ones of filling silver discussed above. The only difference is the firing temperature and time which are 700° C. and 90 min. Gold is normally used as a moving mass, but not as a sacrificial material due to it high cost. FIG. 15A shows a photo image of a real silicon mold 312 for forming the layer 172 (the moving mass layer). The silicon mold 312 comprises a silicon frame 314 inside which is a cavity 316 for being filled with a proper moving mass material. FIG. 15B shows a photo image of the silicon mold 312 in which the cavity 316 has been filled with gold 318. Note that we may also fill silver into this silicon mold. Then the silver filled in the cavity 316 is as a moving mass. The silver filled in the remaining portion of the silicon mold 312 is as a sacrificial materials.

Figure 16:
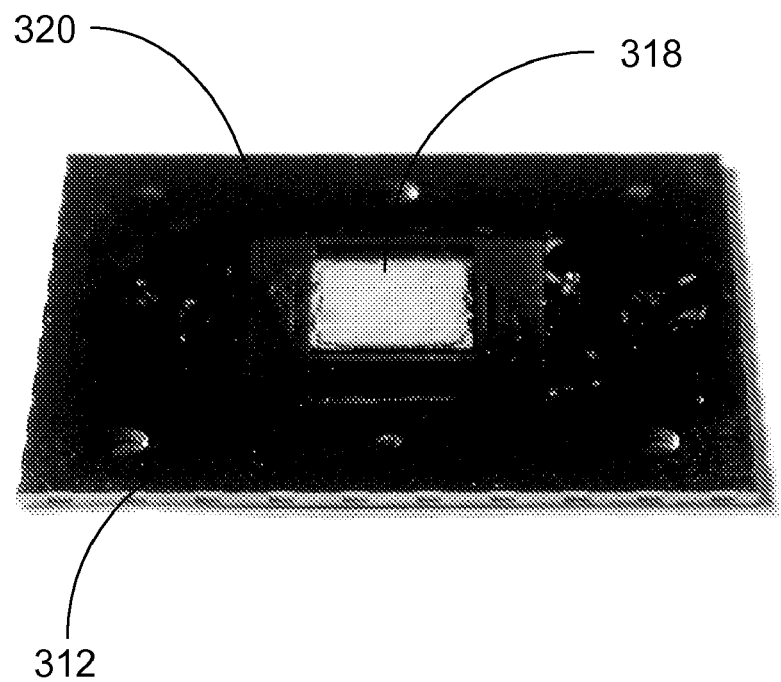
FIG. 16 shows a photo image of the real silicon mold shown in FIG. 15B, which is filled with an epoxy in the remaining portion of the silicon mold to be as a sacrificial material after the gold is filled into the central cavity.

The above disclosed filling materials and methods may be used alone or combined. For example, FIG. 16 shows a photo image of the silicon mold 312 in which the gold 318 is filled in the cavity 316 and Epo-Tek 301 epoxy 320 is filled in the remaining portion of the silicon mold 312. In this example, the gold 318 is as a moving mass and the epoxy 320 is as a sacrificial material. Alternatively, instead of using the epoxy 320 as a sacrificial material, we may fill silver as a sacrificial material.

Note that a silicon mold may be fully filled with a sacrificial material such as the examples shown in FIGS. 14 and 16. However, this is not necessary. A sacrificial material may be only filled into the desired locations of a silicon mold. This is because a sacrificial material is used to bond the discrete features of a layer together. As long as the discrete features are combined together, it will be fine even the silicon mold is not fully filled with the sacrificial material.

After filling a sacrificial material into a silicon mold, the mold will be covered with the sacrificial material. We need to planarize the both sides of the mold to expose both materials (silicon and the sacrificial material) so that we can obtain a required two-material layer. A planarization process will also realize: 1) a precise layer thickness; 2) flat surfaces; 3) smooth surfaces; and 4) clean surfaces for the following silicon direct bonding. As mentioned above, this planarization process can also eliminate non-uniform etch depth distribution caused by DRIE.

Silicon lapping, grinding, and polishing are standard processes in MEMS and microelectronics. Suitable planarization processes for Si-Assemblayer™ may comprise grinding, lapping, polishing, CMP (chemical mechanical polishing), and the combinations of the above processes.

One suitable planarization process is the combination of lapping or grinding and CMP. Lapping or grinding is used to quickly remove the top sacrificial material and thin down backside silicon. When the two-material patterns are exposed on both sides, then CMP is used to realize the required silicon flatness and smoothness suitable for silicon direct bonding.

Figure 17:
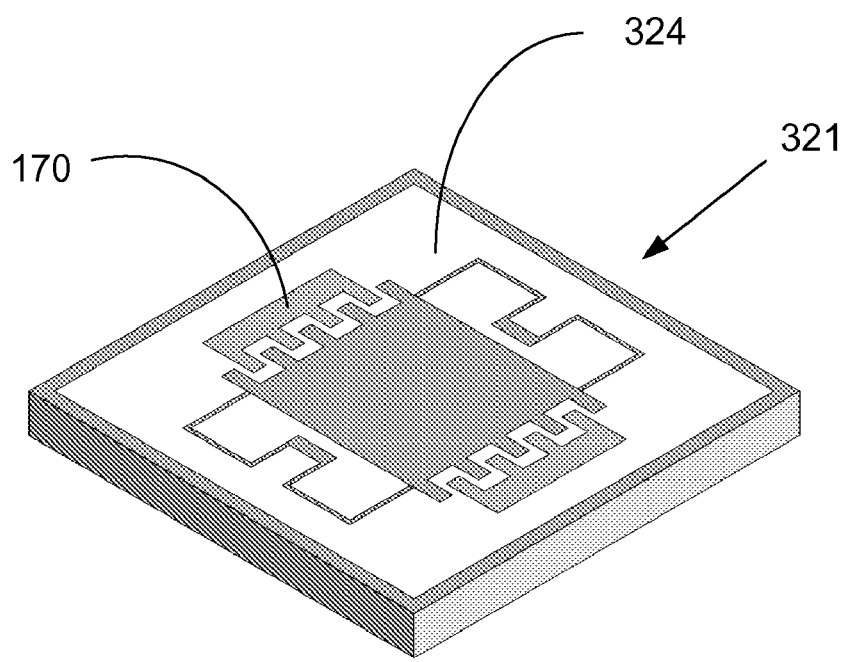
FIG. 17 schematically illustrates a perspective view of a planarized variable capacitor layer comprising a silicon structural material and a sacrificial material.

FIG. 17 schematically illustrates a perspective view of a formed layer 321 after planarization comprising the variable capacitor layer structure 170 that is embedded in a sacrificial material 324. Note that after planarization the structure 170 comprises three discrete silicon features that are combined with the sacrificial material 324 such as silver. This is the function of sacrificial material for serving as an "adhesive."

Silicon direct bonding is used to bond the formed layers 170, 172, 174, 204 and 206 together to form the energy harvester structure 173. Silicon direct bonding refers to bonding of mirror-polished silicon wafers without any intermediate layer at the interface. Therefore, with this bonding technology, a group of single silicon layers will become a monolithic silicon structure after they are bonded together.

Currently, silicon direct bonding can be realized mainly by two methods, fusion bonding and plasma activation bonding. No matter which method is used, silicon direct bonding involves three basic steps: silicon surface activation, pre-bonding at room-temperature, and final annealing or heat treatment at an elevated temperature to reach a desired bonding strength.

In fusing bonding, clean silicon surface is activated in a suitable chemical solution. SC-1 and Piranha are two widely used chemical solutions. SC-1 is a 1:1:5 solution of $NH_4OH$, $H_2O_2$ and $H_2O$. The piranha solution is a mixture of 4:1 concentrated sulfuric acid to 30% hydrogen peroxide solution. After activation in either SC-1 or Piranha, the silicon surface becomes hydrophilic and contains —OH groups. Pre-bonding is performed by bringing activated silicon wafers together at room temperature. The wafers will bond spontaneously. However, the Si—Si bonding strength achieved at room-temperature is quite weak. Therefore, the bonded wafers need to be annealed at an elevated temperature to strengthen the bonds across the interface. This final annealing requires a typical annealing temperature of 1,100° C. To successful bonding of silicon wafers, the silicon surface must meet the required surface flatness and roughness. For example, for the bonding of 4" silicon wafers, this technology requires a surface roughness less than 1 nm and a surface flatness on the order of 5 µm.

Plasma activation bonding has been developed to reduce the anneal temperature down to below 400° C. to increase the applications of silicon direction bonding. This technology uses chemically reactive plasma discharges to increase the surface energy of silicon wafers. Plasma activation (dry activation) avoids the contact of silicon wafers with highly corrosive chemical solutions such as SC-1 and Piranha. After pre-bonding of the silicon wafers, the bonded wafers only needs to be annealed at a low temperature (200-300° C. typically) to achieve the similar strong bonding strength as fusion bonding. For example, SUSS's nanoPREP Module nP200 uses a plasma activation method for silicon direct bonding, which reduces the silicon bonding temperature from above 1000° C. down to 200° C. One benefit of plasma activation bonding is that silicon wafers with a roughness up to 2 nm may be bonded.

Silicon bonding in Si-Assemblayer™ is different from the above standard silicon direct bonding in that silicon layers does not comprise silicon only. The layers also comprises a sacrificial material (e.g., epoxy or silver). Therefore, the effects of two main physical properties of the sacrificial material on the annealing temperature must be taken into account. The first relevant property is the melting point of the sacrificial material. For example, silver has a melting point of 962° C. while the epoxy, Epo-Tek 301, softens at above 150° C. The second relevant property is the coefficient of thermal expansion (CTE) of the sacrificial material. For example, the CTEs (in $10^{-6}$/K) of silicon, the epoxy and silver are 2.6, 18.9, and 98, respectively. The thermal stress resulting from the mismatch in the coefficient of thermal expansion between silicon and sacrificial material may damage or deform a bonded multi-layer silicon structure during annealing. From the above facts and analysis, the annealing temperature must be controlled as low as possible in Si-Assemblayer™. The annealing temperature must be lower than 150° C., ideally around 100° C., for epoxy-filled silicon layers. An annealing temperature of 200-300° C. may be workable for silver-filled silicon layers though a lower annealing temperature is preferred.

The compatibility of a sacrificial material with the wet or dry activation also needs to be considered. For example, epoxy is not compatible with SC-1 or Piranha, but compatible with plasma activation. For silicon-epoxy layers, plasma activation is the choice. Silver is compatible with plasma activation, but is weakly compatible with SC-1 or Piranha. Though silver is a noble metal, SC-1 or Piranha can etch silver. The etch rate depends on the composition and temperature of SC-1 or Piranha. There are other chemicals that can be used to activate silicon. Therefore wet activation may work for silicon-silver layers by using either modified SC-1 or Piranha, or other chemicals that are more compatible with silver.

From the above discussion, standard plasma activation bonding with an annealing temperature of 200-300° C. may work for silicon-silver layers. However, it may not work for a case where a lower annealing temperature is required or preferred. We may use an alternative method to solve this problem. This method includes three steps. It works for both wet and dry activation. The first step is low-temperature (e.g., <200° C.) annealing. The purpose of this step is to just bond layers together with a bonding strength suitable for the second step. As bonding strength depends on temperature and time. We can extend annealing time to reach a saturated bonding strength at a certain annealing temperature. This is a way to increase bonding strength at a lower annealing temperature. Nevertheless, the bonding strength achieved at this step is usually not high. The second step is to remove the sacrificial material. The bonding strength achieved at the first step must assure that the bonded layers will not be separated during the removal of the sacrificial material. The third step is to anneal the bonding layers again at a higher temperature to reach a required higher bonding strength if it is not reached at the first step. As the sacrificial material has been removed or mostly removed, annealing at a higher temperature may be workable.

From literature, silicon wafers can be bonded without an external force. However an external pressure can facilitate the bonding of silicon layers.

For plasmas activation, various gases can be used. For example, oxygen, nitrogen, helium and argon. Plasma activation can be done in a low pressure environment or just in an ambient pressure environment. In addition, corona treatment with a corona treater using air can also be used to activate silicon in an ambient pressure environment.

To eliminate the influence of the sacrificial material during silicon bonding, we may slightly etch it so that its surfaces are slightly lower than the silicon surfaces. As the sacrificial material are now below the silicon surfaces, the bonding only involves silicon surfaces. Note that the function of sacrificial material is to hold discrete silicon features together. It is not necessary to keep its surfaces and silicon surfaces flush.

For a successful silicon bonding, the layers to be bonded together need to be cleaned so that all surfaces are clean without particles. For this purpose, we may use ultrasonic cleaning, megasonic cleaning, or both. Silicon bonding is preferred to be operated in a controlled environment such as a suitable cleanroom. Silicon fusion bonding and plasmas activation bonding are standard processes. Those skilled in the art will understand there are many bonding procedures, protocols, books, literature that can be accessed publicly. For example, one bonding procedure basically include: 1) ultrasonic cleaning, 2) plasma activation, 3) megasonic cleaning, 4) stacking and alignment, 5) pre-bonding, and 6) annealing.

Figure 18:
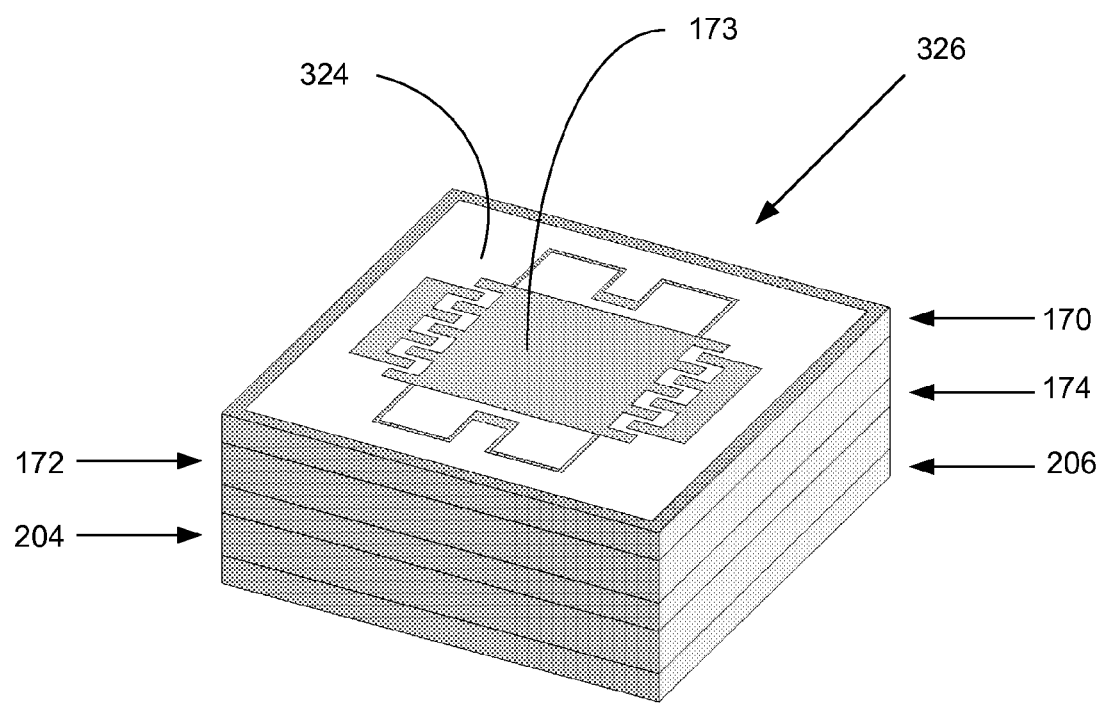
FIG. 18 schematically illustrate a perspective view of a bonded five-layer structure that comprises a multi-layer silicon-based electrostatic energy harvester structure that is embedded in a sacrificial material.

FIG. 18 schematically illustrates a perspective view of a bonded five-layer structure 326 that comprises the layer structures 170, 172, 174, 204, and 206. Note that the multi-layer energy harvester structure 173 is embedded in the sacrificial material 324.

The selective removal of the sacrificial material 324 from the structure 326 is to release the multi-layer structure 173. The requirements of this etching operation include: 1) no significant damage to the silicon structures; 2) no damage to weaken the adhesion between the bonded silicon structures; and 3) fast and complete removal.

A specific removal method is needed for a specific sacrificial material. For example, a chemical etchant can be used to etch copper away from silicon. Various copper etchants are commercially available. For example, a suitable copper etchant is Enstrip® C-38 manufactured by Enthone, which is compatible with silicon and has a fast copper removal rate up to 8 µm/min at 20° C.

It is usually difficult to completely and quickly dissolve or remove an epoxy from a base material with a commercial epoxy remover. However, in our case, we need to remove the epoxy from silicon. Silicon is very resistant to some strong acids and oxidizers. Therefore, wet etching of epoxy is a safe removal method as it does not need a high temperature (less than 100° C.) and its etch rate can be controlled. A preferred etchant for epoxy is the piranha solution. It is widely used in microelectronics and MEMS to remove organic residues or strip photoresist from silicon wafers. It can also dissolve the epoxy quickly and completely.

There are commercial silver etchants such as Silver Etchant TFS (Transene Company, Inc.). The piranha solution can also be used to etch silver. Though silver is a noble metal, the piranha solution can dissolve it completely.

The piranha solution is completely compatible with silicon and silicon oxide and will not attack and damage them. In addition, it will not attack and damage the interfaces between bonded silicon layers to cause the adhesion failure or delamination of the bonded silicon layers.

Though this specification have provided various embodiments and examples, it is not intended that teachings in a specific embodiment or in a specific example is limited from applying to other embodiments or examples. For example, it should be understood that alternatives acknowledged in association with one embodiment or one example, are intended to apply to all embodiments or all examples to the extent that the features of the different embodiments or examples make such application functional and do not otherwise contradict or remove all benefits of the adopted embodiments or examples. Various other embodiments of the present invention exist. Some of these embodiments may be based on a combination of the teachings herein with various teachings incorporated herein by reference.

It should note that all the features disclosed as well as combinations of the features disclosed are the object of this invention. While the present invention has been described with reference to particular embodiments and examples thereof, it will be understood that many further embodiments, alternatives, modifications and implementations will be apparent by those skilled in the art without actually departing from the spirit and scope of the invention as defined in the above description. As such, it is not intended that the invention be limited to the particular illustrative embodiments and examples described above but instead that it be solely limited by the claims presented hereafter.

What is claimed is:

1. An electrostatic energy harvester, comprising:
a multi-layer structure, comprising: a plurality of variable capacitor layers, each comprising at least one fixed electrode, a movable electrode, and at least one spring structure supporting the movable electrode wherein the at least one fixed electrode forms at least one variable capacitor with the movable electrode,
wherein the variable capacitor layers form at least one multi-layer variable capacitor comprising at least one multi-layer fixed electrode, a multi-layer movable electrode, and at least one multi-layer spring structure,
wherein the multi-layer structure comprises at least one structure having one of the variable capacitor layers in direct contact with another of the variable capacitor layers, and
wherein the variable capacitor layers each comprise at least silicon.

2. The energy harvester of claim 1, further comprising:
(a) a substrate; and
(b) a plurality of anchor components secured to the substrate,
wherein the at least one multi-layer variable capacitor is anchored to the substrate by bonding the at least one multi-layer fixed electrode and the at least one multi-layer spring structure to the anchor components, and
wherein the multi-layer movable electrode is suspended above the substrate by the at least one multi-layer spring structure.

3. The energy harvester of claim 1 wherein the at least one fixed electrode and the movable electrode each comprise a plurality of comb fingers wherein the comb fingers of the at least one fixed electrode are arranged to be interdigitated with the comb fingers of the movable electrode to form at least one variable comb capacitor.

4. An electrostatic energy harvester, comprising:
(a) at least two variable capacitor layers, each comprising at least one fixed electrode, a movable electrode, and at least one spring structure supporting the movable electrode wherein the at least one fixed electrode forms at least one variable capacitor with the movable electrode; and
(b) at least one moving mass layer, each comprising at least one moving mass component and a plurality of separate connection components,
wherein the at least two variable capacitor layers and the at least one moving mass layer are bonded together to form a multi-layer structure comprising at least one multi-layer variable capacitor comprising at least one multi-layer fixed electrode, a multi-layer movable electrode, and at least one multi-layer spring structure,
wherein the at least one multi-layer fixed electrode and the at least one multi-layer spring structure each comprise at least one connection component,
wherein the at least one moving mass component of each moving mass layer is a portion of the multi-layer movable electrode, and
wherein the multi-layer structure comprises at least one structure having at least one moving mass layer disposed between two variable capacitor layers.

5. The energy harvester of claim 4, further comprising:
(a) a substrate; and
(b) a plurality of anchor components secured to the substrate,
wherein the at least one multi-layer variable capacitor is anchored to the substrate by bonding the at least one multi-layer fixed electrode and the at least one multi-layer spring structure to the anchor components, and
wherein the multi-layer movable electrode is suspended above the substrate by the at least one multi-layer spring structure.

6. The energy harvester of claim 4 wherein the at least one fixed electrode and the movable electrode each comprise a plurality of comb fingers wherein the comb fingers of the at least one fixed electrode are arranged to be interdigitated with the comb fingers of the movable electrode to form at least one variable comb capacitor.

7. The energy harvester of claim 4 wherein the at least two variable capacitor layers and the at least one moving mass layer each comprise at least single crystal silicon.

8. The energy harvester of claim 4 wherein at least one moving mass component comprises a material having the same density as the movable electrode or a higher density than the movable electrode.

9. The energy harvester of claim 8 wherein the material comprises silver or gold.

10. The energy harvester of claim 9 wherein the material is formed by firing at least silver or gold particles.

11. The energy harvester of claim 4 wherein at least one moving mass component comprises at least one cavity and wherein at least one material is filled in the at least one cavity.

12. The energy harvester of claim 4 wherein the at least two variable capacitor layers and the at least one moving mass layer are formed separately from each other and thereafter bonded together.

13. An electrostatic energy harvester, comprising:
(a) a substrate; and
(b) a plurality of variable capacitor layers secured to the substrate, each comprising at least one fixed electrode and a movable electrode being movable with respect to the substrate, wherein the at least one fixed electrode forms at least one variable capacitor with the movable electrode,
wherein at least two of the variable capacitor layers are located at different heights above a same surface of the substrate and are located separately from each other,
wherein the at least two variable capacitor layers are secured at different locations on the substrate, and
wherein each of the at least two variable capacitor layers is secured directly to the substrate.

14. The energy harvester of claim 13 wherein the at least one fixed electrode and the movable electrode each comprise a plurality of comb fingers wherein the comb fingers of the at least one fixed electrode are arranged to be interdigitated with the comb fingers of the movable electrode to form at least one variable comb capacitor.

15. An electrostatic device, comprising:
(a) a substrate; and
(b) a multi-layer structure secured to the substrate, comprising: at least two variable capacitor layers and at least one moving mass layer,
wherein each variable capacitor layer comprises at least one fixed electrode and a movable electrode wherein the at least one fixed electrode forms at least one variable capacitor with the movable electrode,
wherein each moving mass layer comprises at least one moving mass component comprising at least one material having a higher density than buried silicon dioxide in an SOI (silicon-on-insulator) substrate,
wherein the at least two variable capacitor layers and the at least one moving mass layer form at least one multi-layer variable capacitor comprising at least one multi-layer fixed electrode and a multi-layer movable electrode being movable with respect to the substrate,
wherein the at least one moving mass component of each moving mass layer is a portion of the multi-layer movable electrode, and
wherein the multi-layer structure comprises at least one structure having at least one moving mass layer disposed between two variable capacitor layers.

16. The electrostatic device of claim 15 wherein the at least one fixed electrode and the movable electrode each comprise a plurality of comb fingers wherein the comb fingers of the at least one fixed electrode are arranged to be interdigitated with the comb fingers of the movable electrode to form at least one variable comb capacitor.

17. The electrostatic device of claim 15 wherein the at least one moving mass component of at least one moving mass layer comprises a material having the same density as the movable electrode or a higher density than the movable electrode.

18. The electrostatic device of claim 15 wherein the at least one moving mass component of at least one moving mass layer comprises at least one cavity.

19. The electrostatic device of claim 18 wherein the at least one cavity is filled with at least one material having a higher density than the at least one moving mass component comprising the at least one cavity.

20. The electrostatic device of claim 15 wherein the at least two variable capacitor layers and the at least one moving mass layer each comprise at least single crystal silicon.

* * * * *